United States Patent
Morris et al.

(10) Patent No.: US 11,670,364 B2
(45) Date of Patent: Jun. 6, 2023

(54) ARTIFICIAL REALITY SYSTEM WITH REDUCED SRAM POWER LEAKAGE

(71) Applicant: Meta Platforms Technologies, LLC, Menlo Park, CA (US)

(72) Inventors: Daniel Henry Morris, Mountian View, CA (US); Alok Kumar Mathur, Cupertino, CA (US)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 73 days.

(21) Appl. No.: 17/303,084

(22) Filed: May 19, 2021

(65) Prior Publication Data
US 2022/0375511 A1 Nov. 24, 2022

(51) Int. Cl.
| | | |
|---|---|---|
| G11C 11/417 | (2006.01) | |
| G11C 5/14 | (2006.01) | |
| G11C 11/4074 | (2006.01) | |
| H03K 17/16 | (2006.01) | |

(52) U.S. Cl.
CPC .............. *G11C 11/417* (2013.01); *G11C 5/14* (2013.01); *G11C 11/4074* (2013.01); *H03K 17/165* (2013.01)

(58) Field of Classification Search
CPC ..... G11C 11/417; G11C 5/14; G11C 11/4074; H03K 17/165
See application file for complete search history.

(56) References Cited

U.S. PATENT DOCUMENTS

| | | | | |
|---|---|---|---|---|
| 6,208,170 | B1 * | 3/2001 | Iwaki | G11C 5/14 326/119 |
| 7,177,176 | B2 * | 2/2007 | Zheng | G11C 11/412 365/189.11 |
| 7,863,971 | B1 * | 1/2011 | Nayak | H03K 19/0016 327/543 |
| 7,952,422 | B2 * | 5/2011 | Chuang | G11C 11/412 327/544 |

(Continued)

OTHER PUBLICATIONS

Clinton et al., "A Low-Power and High-Performance 10nm SRAM Architecture for Mobile Applications", IEEE, Mar. 6, 2017, 210-211 pp.

(Continued)

*Primary Examiner* — Khamdan N. Alrobaie
(74) *Attorney, Agent, or Firm* — Shumaker & Sieffert, P.A.

(57) ABSTRACT

System on a Chip (SoC) integrated circuits are configured to reduce Static Random-Access Memory (SRAM) power leakage. For example, SoCs configured to reduce SRAM power leakage may form part of an artificial reality system including at least one head mounted display. Power switching logic on the SoC includes a first power gating transistor that supplies a first, higher voltage to an SRAM array when the SRAM array is in an active state, and a third power gating transistor that isolates a second power gating transistor from the first, higher voltage when the SRAM array is in the active state. The second power gating transistor further supplies a second, lower voltage to the SRAM array when the SRAM array is in a deep retention state, such that SRAM power leakage is reduced in the deep retention state.

20 Claims, 15 Drawing Sheets

(56) References Cited

U.S. PATENT DOCUMENTS

| | | | |
|---|---|---|---|
| 2006/0262610 A1* | 11/2006 | Khellah | G11C 5/14 |
| | | | 365/189.09 |
| 2007/0063763 A1* | 3/2007 | Yoo | G11C 11/4074 |
| | | | 327/544 |
| 2007/0081378 A1* | 4/2007 | Kawa | H03K 19/0016 |
| | | | 365/100 |
| 2008/0151673 A1* | 6/2008 | Fallah | G11C 11/417 |
| | | | 365/226 |
| 2010/0149884 A1* | 6/2010 | Kumar | G11C 5/147 |
| | | | 365/189.09 |
| 2011/0261629 A1 | 10/2011 | Seshadri et al. | |
| 2012/0087196 A1* | 4/2012 | Yang | G11C 11/417 |
| | | | 365/226 |
| 2014/0036612 A1* | 2/2014 | Rai | G11C 11/417 |
| | | | 365/227 |
| 2018/0089356 A1* | 3/2018 | Park | G06F 30/394 |
| 2021/0089475 A1 | 3/2021 | Mathur et al. | |

OTHER PUBLICATIONS

International Search Report and Written Opinion for International Application No. PCT/US2022/029351 dated Aug. 12, 2022, 13 pages.

\* cited by examiner

ARTIFICIAL REALITY SYSTEM WITH REDUCED SRAM POWER LEAKAGE

TECHNICAL FIELD

The disclosure generally relates to artificial reality systems, such as augmented reality, mixed reality, and/or virtual reality systems.

BACKGROUND

Artificial reality systems are becoming increasingly ubiquitous with applications in many fields such as computer gaming, health and safety, industrial, and education. As a few examples, artificial reality systems are being incorporated into mobile devices, gaming consoles, personal computers, movie theaters, and theme parks. In general, artificial reality is a form of reality that has been adjusted in some manner before presentation to a user, which may include, e.g., a virtual reality, an augmented reality, a mixed reality, a hybrid reality, or some combination and/or derivatives thereof.

Typical artificial reality systems include one or more devices for rendering and displaying content to users. As one example, an artificial reality system may incorporate a head-mounted display (HMD) worn by a user and configured to output artificial reality content to the user. The artificial reality content may entirely comprise content that is generated by the system or may include generated content combined with captured content (e.g., real-world video and/or images). During operation, the user typically interacts with the artificial reality system to select content, launch applications, configure the system and, in general, experience artificial reality environments.

SUMMARY

In general, the disclosure describes techniques in which one or more System on a Chip integrated circuits (SoCs) are configured to reduce Static Random-Access Memory (SRAM) power leakage. In some examples, an artificial reality system includes at least one head mounted display including one more SoCs configured to reduce SRAM power leakage in accordance with one or more techniques of this disclosure. In some examples, the artificial reality system may further include at least one peripheral device including one more SoCs configured to reduce SRAM power leakage in accordance with one or more techniques of this disclosure.

Various low power devices, such as those used in AR/VR systems, may benefit from the reduced power consumption and corresponding reduction in size and weight provided by the SRAM power leakage reduction techniques of this disclosure. For example, a reduction of SRAM power leakage may result in lower overall power consumption by the device and, as a result, a reduction in the amount of power required to operate the device. Due to these reduced power requirements, the device may be powered using smaller battery sizes (smaller in terms of the amount of power provided, the physical dimensions and/or the weight), leading to a corresponding reduction in the size and/or weight of the device. This may further lead to increased comfort for the wearer and a more fully immersive and realistic AR/VR experience. In addition to AR/VR systems, the techniques of this disclosure may also provide similar advantages for low-power devices in other applications, and the disclosure is not limited in this respect. For example, the techniques of this disclosure may be advantageous for low-power devices in many other applications such as autonomous driving, edge-based artificial intelligence, Internet-of-Things, and other applications that may benefit from reduced power consumption and a reduction in size and/or weight.

In one example, the disclosure is directed to an artificial reality system comprising: a plurality of processors; and a Static Random Access Memory (SRAM) unit in communication with the plurality of processors, the SRAM unit comprising: an SRAM array including a plurality of SRAM bitcells; and power switching logic comprising a first power gating transistor, a second power gating transistor, and a third power gating transistor, and wherein: during an active state, the first power gating transistor supplies a first, higher voltage to the SRAM array; during the active state, the third power gating transistor isolates the second power gating transistor from the first, higher voltage; and during a deep retention state, the second power gating transistor supplies a second, lower voltage to the SRAM array, such that SRAM power leakage experienced by the SRAM array in the deep retention state is less than the SRAM power leakage experienced by the SRAM array in the active state.

In another example, the disclosure is directed to a method for controlling SRAM power leakage in a System on a Chip (SoC) integrated circuit, the SoC integrated circuit including a power management controller, the method comprising: during an active state, generating, by the power management controller, an active state enable signal that enables a first power gating transistor to supply a first, higher voltage to an SRAM array;

during the active state, supplying, by the power management controller, the active state enable signal to a third power gating transistor to isolate a second power gating transistor from the first, higher voltage; and during a deep retention state, generating, by the power management controller, a retention enable signal that enables the second power gating transistor to supply a second, lower voltage to the SRAM array, such that SRAM power leakage experienced by the SRAM array in the deep retention state is less than the SRAM power leakage experienced by the SRAM array in the active state.

In another example, the disclosure is directed to a computer-readable storage medium comprising instructions that, when executed, configure processing circuitry to: during an active state, generate, by a power management controller, an active state enable signal that enables a first power gating transistor to supply a first, higher voltage to an SRAM array when the SRAM array is in an active state; during the active state, supply, by a power management controller, the active state enable signal to a third power gating transistor to isolate a second power gating transistor from the first, higher voltage; and during a deep retention state, generate, by the power management controller, a retention enable signal that enables the second power gating transistor to supply a second, lower voltage to the SRAM array, such that SRAM power leakage experienced by the SRAM array in the deep retention state is less than the SRAM power leakage experienced by the SRAM array in the active state.

The details of one or more examples of the techniques described herein are set forth in the accompanying drawings and the description below. Other features, objects, and advantages of the techniques described herein will be apparent from the description and drawings, and from the claims.

DETAILED DESCRIPTION

Figure 1A:
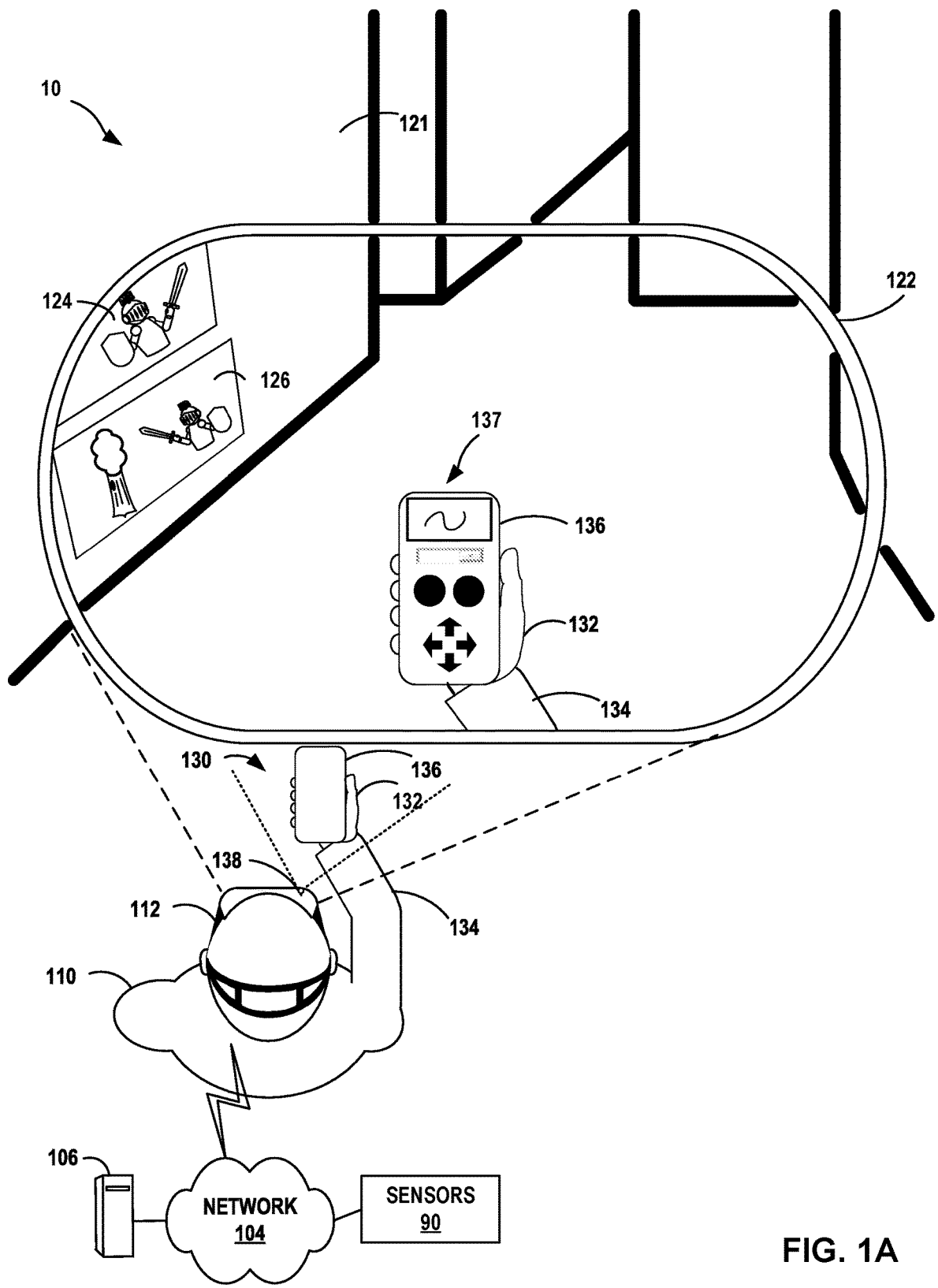
FIG. 1A is an illustration depicting an example artificial reality system in which one or more SoC integrated circuits are configured to reduce SRAM power leakage, in accordance with one or more techniques described in this disclosure.

High Static Random-Access Memory (SRAM) leakage can be an issue for certain types of System on a Chip integrated circuits (SoCs). In artificial reality (AR) applications, for example, SRAM power leakage may lead to higher power consumption, decreased battery life, increased battery sizes, and increased size and/or weight of AR devices implemented using SoCs such as head mounted displays, AR glasses, hand held or wearable peripheral devices, etc. These factors may negatively impact the AR user experience.

Increasing the amount of SRAM on an SoC integrated circuit may provide the advantage of increasing processing speed by reducing inefficient off-chip bandwidth, but all SRAM consumes power even when it is not being actively used. For example, for some SoCs, SRAM power leakage can be a significant fraction of the total SoC power budget. While there are existing techniques to reduce leakage power, all have drawbacks. For example, power-gating (shutting off power to the SRAM) is not always possible because SRAM data contents would be lost. Reducing rail voltage would reduce power but this is not usually possible as the rail voltage is required by other SoC components. Adjusting settings of the PMIC (power management integrated circuit) is not always possible because multiple IP cores (IPs) are usually connected to the shared PMIC rails. Also, PMIC latency may be very high (e.g., up to milliseconds). Other existing techniques include locally generating a lower voltage to the SRAM through a so-called "diode-drop technique." The low voltage means that less power is consumed in the SRAM. However, power is still consumed in the diode-drop circuit due to its inherent resistance so the benefits are diminished. Additionally, diode-drop techniques are highly sensitive to process, voltage, and temperature (PVT) variation.

In accordance with one or more techniques of this disclosure, an SoC integrated circuit is configured to reduce SRAM power leakage. In some examples, an artificial reality system may include one or more SoC integrated circuits configured to reduce SRAM power leakage in accordance with one or more techniques of this disclosure.

Low power SRAM arrays include a "dual rail" design in which a first, relatively higher SRAM voltage (e.g., 0.75V) and a second, relatively lower logic voltage (e.g., 0.6V) are routed to the array. In accordance with one or more techniques of this disclosure, an SRAM unit includes power switching logic configured to switch an SRAM array between an "active" state in which the first voltage is supplied to the SRAM array and a "deep retention" state in which the second voltage is supplied to the SRAM array. Power-gating devices (e.g., transistors) are used to switch the SRAM bitcells between the two power rails. Power grid and PMIC overhead is low because the power rails already exist, are already routed to the SRAM array, and has capacity to supply leakage-level currents. Design area is low because existing power gating transistors are reused. Power savings can be greater than the "diode-drop approach" because, in addition to reducing current, the voltage is reduced as there is no large voltage drop across the switching device. In addition, PVT margining is not as high as compared to the diode-drop approach, leading to further increase in savings potential. In some examples, the deep retention state may reduce SRAM power leakage by 33% as compared to the active state in a manner that is highly robust to PVT variation and has less than 2% area overhead.

Various low power devices, such as those used in AR systems, may benefit from the reduced power consumption and corresponding reduction in size and weight provided by the SRAM power leakage reduction techniques of this disclosure. For example, a reduction of SRAM power leakage may result in lower overall power consumption by the device and, as a result, a reduction in the amount of power required to operate the device. Due to these reduced power requirements, the device may be powered using smaller battery sizes (smaller in terms of the amount of power provided, the physical dimensions and/or the weight), leading to a corresponding reduction in the size and/or weight of the device. This may further lead to increased comfort for the wearer and a more fully immersive and realistic AR experience. In addition to AR systems, the techniques of this disclosure may also provide similar advantages for low-power devices in other applications, and the disclosure is not limited in this respect. For example, the techniques of this disclosure may be advantageous for low-power devices in many other applications such as autonomous driving, edge-based artificial intelligence, Internet-of-Things, and other applications which may benefit from reduced power consumption and a reduction in size and/or weight.

FIG. 1A is an illustration depicting an example artificial reality system in which one or more System on Chip (SoC) integrated circuits are configured to reduce Static Random-Access Memory (SRAM) power leakage in accordance with one or more techniques of this disclosure. The artificial reality system may be a virtual reality system, an augmented reality system, or a mixed reality system. In the example of FIG. 1A, artificial reality system 10 includes HMD 112, peripheral device 136, and may in some examples include one or more external sensors 90 and/or console 106.

HMD 112 is typically worn by user 110 and includes an electronic display and optical assembly for presenting artificial reality content 122 to user 110. In addition, HMD 112 includes one or more sensors (e.g., accelerometers) for tracking motion of the HMD 112 and may include one or more image capture devices 138 (e.g., cameras, line scanners) for capturing image data of the surrounding physical environment. Although illustrated as a head-mounted display, AR system 10 may alternatively, or additionally, include glasses or other display devices for presenting artificial reality content 122 to user 110.

In this example, console 106 is shown as a single computing device, such as a gaming console, workstation, a desktop computer, or a laptop. In other examples, console 106 may be distributed across a plurality of computing devices, such as distributed computing network, a data center, or cloud computing system. Console 106, HMD 112, and sensors 90 may, as shown in this example, be communicatively coupled via network 104, which may be a wired or wireless network, such as Wi-Fi, a mesh network or a short-range wireless communication medium, or combination thereof. Although HMD 112 is shown in this example as in communication with, e.g., tethered to or in wireless communication with, console 106, in some implementations HMD 112 operates as a stand-alone, mobile artificial reality system.

In general, artificial reality system 10 uses information captured from a real-world, 3D physical environment to render artificial reality content 122 for display to user 110. In the example of FIG. 1A, a user 110 views the artificial reality content 122 constructed and rendered by an artificial reality application executing on HMD 112 and/or console 106. In some examples, artificial reality content 122 may comprise a mixture of real-world imagery (e.g., hand 132, peripheral device 136, walls 121) and virtual objects (e.g., virtual content items 124, 126 and virtual user interface 137) to produce mixed reality and/or augmented reality. In some examples, virtual content items 124, 126 may be mapped (e.g., pinned, locked, placed) to a particular position within artificial reality content 122. A position for a virtual content item may be fixed, as relative to one of wall 121 or the earth, for instance. A position for a virtual content item may be variable, as relative to peripheral device 136 or a user, for instance. In some examples, the particular position of a virtual content item within artificial reality content 122 is associated with a position within the real-world, physical environment (e.g., on a surface of a physical object).

In this example, peripheral device 136 is a physical, real-world device having a surface on which AR system 10 overlays virtual user interface 137. Peripheral device 136 may include one or more presence-sensitive surfaces for detecting user inputs by detecting a presence of one or more objects (e.g., fingers, stylus) touching or hovering over locations of the presence-sensitive surface. In some examples, peripheral device 136 may include an output display, which may be a presence-sensitive display. In some examples, peripheral device 136 may be a smartphone, tablet computer, personal data assistant (PDA), or other hand-held device. In some examples, peripheral device 136 may be a smartwatch, smartring, or other wearable device. Peripheral device 136 may also be part of a kiosk or other stationary or mobile system. Peripheral device 136 may or may not include a display device for outputting content to a screen.

In the example artificial reality experience shown in FIG. 1A, virtual content items 124, 126 are mapped to positions on wall 121. The example in FIG. 1A also shows that virtual content item 124 partially appears on wall 121 only within artificial reality content 122, illustrating that this virtual content does not exist in the real world, physical environment. Virtual user interface 137 is mapped to a surface of peripheral device 136. As a result, AR system 10 renders, at a user interface position that is locked relative to a position of peripheral device 136 in the artificial reality environment, virtual user interface 137 for display at HMD 112 as part of artificial reality content 122. FIG. 1A shows that virtual user interface 137 appears on peripheral device 136 only within artificial reality content 122, illustrating that this virtual content does not exist in the real-world, physical environment.

The artificial reality system 10 may render one or more virtual content items in response to a determination that at least a portion of the location of virtual content items is in the field of view 130 of user 110. For example, artificial reality system 10 may render a virtual user interface 137 on peripheral device 136 only if peripheral device 136 is within field of view 130 of user 110.

During operation, the artificial reality application constructs artificial reality content 122 for display to user 110 by tracking and computing pose information for a frame of reference, typically a viewing perspective of HMD 112. Using HMD 112 as a frame of reference, and based on a current field of view 130 as determined by a current estimated pose of HMD 112, the artificial reality application renders 3D artificial reality content which, in some examples, may be overlaid, at least in part, upon the real-world, 3D physical environment of user 110. During this process, the artificial reality application uses sensed data received from HMD 112, such as movement information and user commands, and, in some examples, data from any external sensors 90, such as external cameras, to capture 3D information within the real world, physical environment, such as motion by user 110 and/or feature tracking information with respect to user 110. Based on the sensed data, the artificial reality application determines a current pose for the frame of reference of HMD 112 and, in accordance with the current pose, renders the artificial reality content 122.

Artificial reality system 10 may trigger generation and rendering of virtual content items based on a current field of view 130 of user 110, as may be determined by real-time gaze tracking of the user, or other conditions. More specifically, image capture devices 138 of HMD 112 capture image data representative of objects in the real-world, physical environment that are within a field of view 130 of image capture devices 138. Field of view 130 typically corresponds with the viewing perspective of HMD 112. In some examples, the artificial reality application presents artificial reality content 122 comprising mixed reality and/or augmented reality. As illustrated in FIG. 1A, the artificial reality application may render images of real-world objects, such as the portions of peripheral device 136, hand 132, and/or arm 134 of user 110, that are within field of view 130 along the virtual objects, such as within artificial reality content 122. In other examples, the artificial reality application may render virtual representations of the portions of peripheral device 136, hand 132, and/or arm 134 of user 110 that are within field of view 130 (e.g., render real-world objects as virtual objects) within artificial reality content 122. In either example, user 110 is able to view the portions of their hand 132, arm 134, peripheral device 136 and/or any other real-world objects that are within field of view 130 within artificial reality content 122. In other examples, the artificial reality application may not render representations of the hand 132 or arm 134 of the user.

During operation, artificial reality system 10 performs object recognition within image data captured by image capture devices 138 of HMD 112 to identify peripheral device 136, hand 132, including optionally identifying individual fingers or the thumb, and/or all or portions of arm 134 of user 110. Further, artificial reality system 10 tracks the position, orientation, and configuration of peripheral device 136, hand 132 (optionally including particular digits of the hand), and/or portions of arm 134 over a sliding window of time. In some examples, peripheral device 136 includes one or more sensors (e.g., accelerometers) for tracking motion or orientation of the peripheral device 136.

As described above, multiple devices of artificial reality system 10 may work in conjunction in the AR environment, where each device may be a separate physical electronic device and/or separate integrated circuits (e.g., System on a Chip (SoC)) within one or more physical devices. In this example, peripheral device 136 is operationally paired with HMD 112 to jointly operate within AR system 10 to provide an artificial reality experience. For example, peripheral device 136 and HMD 112 may communicate with each other as co-processing devices. As one example, when a user performs a user interface gesture in the virtual environment at a location that corresponds to one of the virtual user interface elements of virtual user interface 137 overlaid on the peripheral device 136, the AR system 10 detects the user interface and performs an action that is rendered to HMD 112.

In accordance with one or more techniques of this disclosure, one or more devices (such as HMD 112 and/or peripheral device 136) of artificial reality system 10 may each include one or more SoC integrated circuits configured to reduce SRAM power leakage in accordance with one or more techniques of this disclosure.

In some example implementations, as described herein, peripheral device 136 and HMD 112 may each include one or more SoC integrated circuits configured to support an artificial reality application, such as SoCs operating as co-application processors, sensor aggregators, display controllers, etc. SoCs may comprise a plurality of processors, a network-on-chip (NoC) and an IPC unit. Processors may include computer processing units (CPUs) (e.g., Reduced Instruction Set Computer (RISC), Advanced RISC machines (ARM), Complex Instruction Set Computer (CISC), etc.), digital signal processors (DSPs), convolutional neural network (CNN) processors, or the like. An NoC is a communication infrastructure that enables data communications between components of one or more SoCs. Such components may include sub-systems of an SoC, processors of a sub-system, other processors of an SoC, and the IPC unit.

Figure 1B:
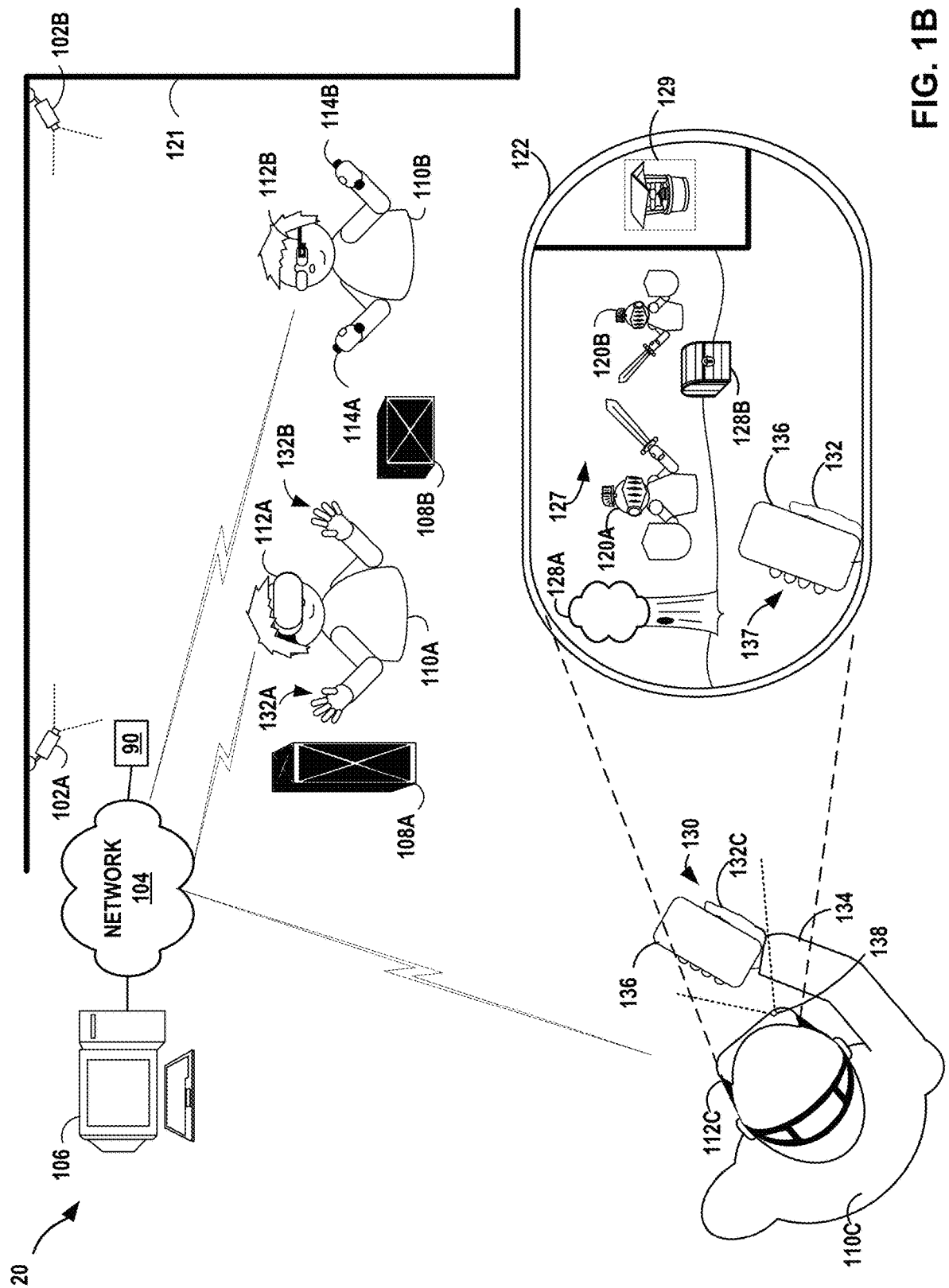
FIG. 1B is an illustration depicting another example artificial reality system in which one or more SoC integrated circuits are configured to reduce SRAM power leakage, in accordance with techniques described in this disclosure.

FIG. 1B is an illustration depicting another example artificial reality system 20 in which one or more SoC integrated circuits are configured to reduce SRAM power leakage in accordance with one or more techniques of this disclosure. For example, HMD 112 and/or peripheral device may each include one or more SoC integrated circuits configured to reduce SRAM power leakage in accordance with one or more techniques of this disclosure. In the example of FIG. 1B, artificial reality system 20 includes external cameras 102A and 102B (collectively, "external cameras 102"), HMDs 112A-112C (collectively, "HMDs 112"), controllers 114A and 114B (collectively, "controllers 114"), console 106, and sensors 90. As shown in FIG. 1B, artificial reality system 20 represents a multi-user environment in which an artificial reality application executing on console 106 and/or HMDs 112 presents artificial reality content to each of users 110A-110C (collectively, "users 110") based on a current viewing perspective of a corresponding frame of reference for the respective user. That is, in this example, the artificial reality application constructs artificial content by tracking and computing pose information for a frame of reference for each of HMDs 112. Artificial reality system 20 uses data received from cameras 102, HMDs 112, and controllers 114 to capture 3D information within the real-world environment, such as motion by users 110 and/or tracking information with respect to users 110 and objects 108, for use in computing updated pose information for a corresponding frame of reference of HMDs 112. As one example, the artificial reality application may render, based on a current viewing perspective determined for HMD 112C, artificial reality content 122 having virtual objects 128A-128B (collectively, "virtual objects 128") as spatially overlaid upon real world objects 108A-108B (collectively, "real world objects 108"). Further, from the perspective of HMD 112C, artificial reality system 20 renders avatars 120A, 120B based upon the estimated positions for users 110A, 110B, respectively.

Each of HMDs 112 concurrently operates within artificial reality system 20. In the example of FIG. 1B, each of users 110 may be a "player" or "participant" in the artificial reality application, and any of users 110 may be a "spectator" or "observer" in the artificial reality application. HMD 112C may operate substantially similar to HMD 112 of FIG. 1A by tracking hand 132 and/or arm 134 of user 110C and rendering the portions of hand 132 that are within field of view 130 as virtual hand 132 within artificial reality content 122. HMD 112B may receive user inputs from controllers 114 held by user 110B. In some examples, controller 114A and/or 114B can correspond to peripheral device 136 of FIG. 1A and operate substantially similar to peripheral device 136 of FIG. 1A. HMD 112A may also operate substantially similar to HMD 112 of FIG. 1A and receive user inputs in the form of gestures performed on or with peripheral device 136 by of hands 132A, 132B of user 110A. HMD 112B may receive user inputs from controllers 114 held by user 110B. Controllers 114 may be in communication with HMD 112B using near-field communication of short-range wireless communication such as Bluetooth, using wired communication links, or using other types of communication links.

As shown in FIG. 1B, in addition to or alternatively to image data captured via camera 138 of HMD 112C, input data from external cameras 102 may be used to track and detect particular motions, configurations, positions, and/or orientations of peripheral device 136 and/or hands and arms of users 110, such as hand 132 of user 110C, including movements of individual and/or combinations of digits (fingers, thumb) of the hand. In some aspects, the artificial reality application can run on console 106, and can utilize image capture devices 102A and 102B to analyze configurations, positions, and/or orientations of hand 132B to identify input gestures that may be performed by a user of HMD 112A. Similarly, HMD 112C can utilize image capture device 138 to analyze configurations, positions, and/or orientations of peripheral device 136 and hand 132C to input gestures that may be performed by a user of HMD 112C. In some examples, peripheral device 136 includes one or more sensors (e.g., accelerometers) for tracking motion or orientation of the peripheral device 136. The artificial reality application may render artificial reality content. Artificial reality content may include virtual content items and/or UI elements, responsive to such gestures, motions, and orientations, such as that described above with respect to FIG. 1A.

Image capture devices 102 and 138 may capture images in the visible light spectrum, the infrared spectrum, or other spectrum. Image processing described herein for identifying objects, object poses, and gestures, for example, may include processing infrared images, visible light spectrum images, and so forth.

Devices of artificial reality system 20 may work in conjunction in the AR environment. For example, peripheral device 136 is paired with HMD 112C to jointly operate within AR system 20. Similarly, controllers 114 are paired with HMD 112B to jointly operate within AR system 20. Peripheral device 136, HMDs 112, and/or controllers 114 may each include one or more SoC integrated circuits configured to enable an operating environment for artificial reality applications.

In accordance with one or more techniques of this disclosure, example HMDs 112 and/or peripheral devices 136 of FIGS. 1A and 1B include one or more SoC integrated circuits configured to reduce SRAM power leakage in accordance with one or more techniques of this disclosure. Various low power devices, such as HMDs 112 and/or peripheral devices 136, may benefit from the reduced power consumption and corresponding reduction in size and weight provided by the SRAM power leakage reduction techniques of this disclosure. For example, a reduction of SRAM power leakage may result in lower overall power consumption by the device and, as a result, a reduction in the amount of power required to operate the device. Due to these reduced power requirements, the device may be powered using smaller battery sizes (smaller in terms of the amount of power provided, the physical dimensions and/or the weight), leading to a corresponding reduction in the size and/or weight of the device. This may further lead to increased comfort for the wearer and a more fully immersive and realistic AR experience. In addition to AR systems, the techniques of this disclosure may also provide similar advantages for low-power devices in other applications, and the disclosure is not limited in this respect. For example, the techniques of this disclosure may be advantageous for low-power devices in many other applications such as autonomous driving, edge-based artificial intelligence, Internet-of-Things, and other applications which may benefit from reduced power consumption and a reduction in size and/or weight.

Figure 2A:
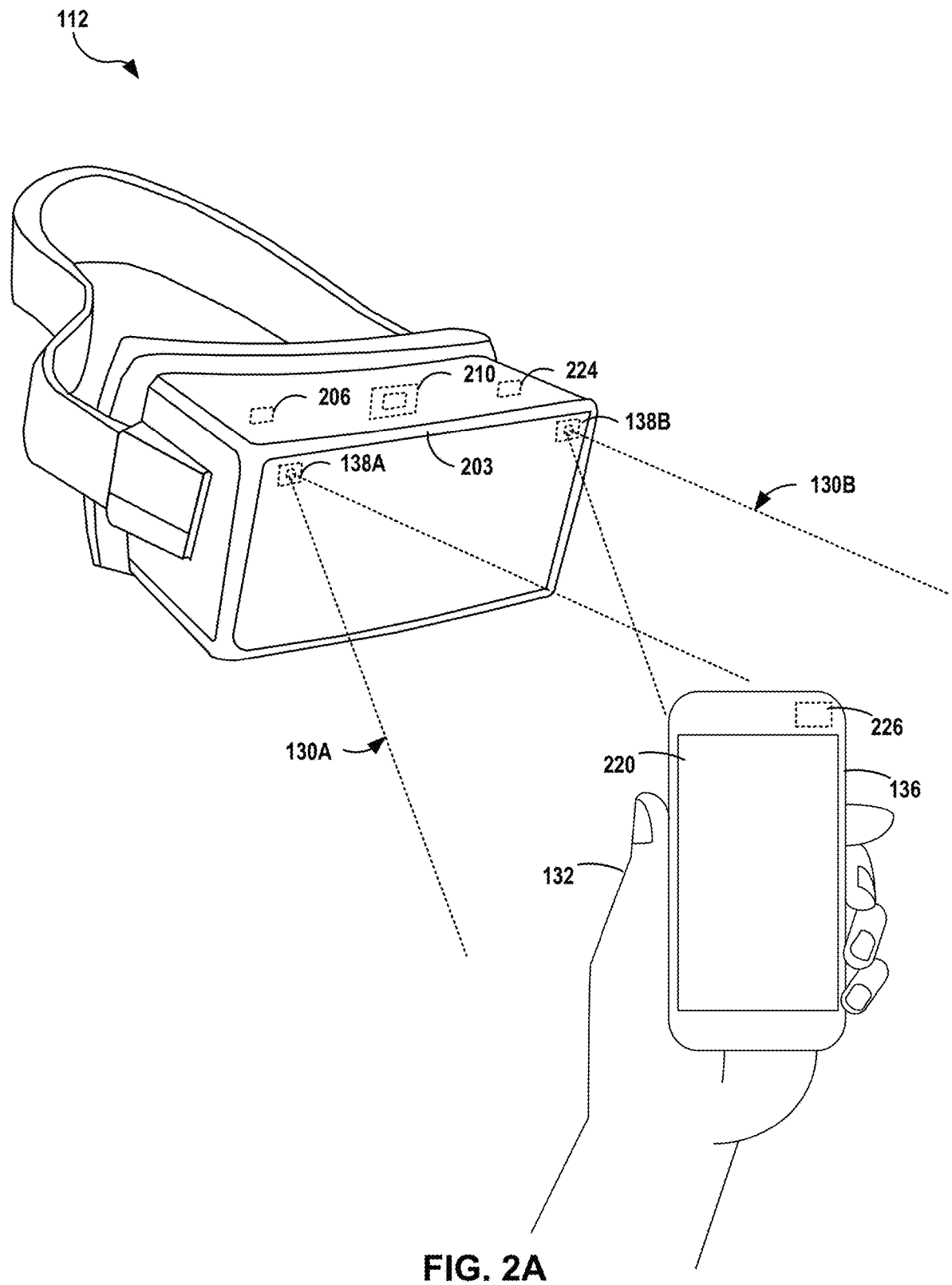
FIG. 2A is an illustration depicting an example HMD and an example peripheral device in which one or more SoC integrated circuits are configured to reduce SRAM power leakage, in accordance with techniques described in this disclosure.

FIG. 2A is an illustration depicting an example HMD 112 and an example peripheral device 136. HMD 112 and/or peripheral device 136 may each include one or more SoC integrated circuits are configured to reduce SRAM power leakage in accordance with one or more techniques of this disclosure. HMD 112 of FIG. 2A may be an example of any of HMDs 112 of FIGS. 1A and 1B. HMD 112 may be part of an artificial reality system, such as artificial reality systems 10, 20 of FIGS. 1A, 1B, or may operate as a stand-alone, mobile artificial realty system configured to implement the techniques described herein.

In this example, HMD 112 includes a front rigid body and a band to secure HMD 112 to a user. In addition, HMD 112 includes an interior-facing electronic display 203 configured to present artificial reality content to the user. Electronic display 203 may be any suitable display technology, such as liquid crystal displays (LCD), quantum dot display, dot matrix displays, light emitting diode (LED) displays, organic light-emitting diode (OLED) displays, cathode ray tube (CRT) displays, e-ink, or monochrome, color, or any other type of display capable of generating visual output. In some examples, the electronic display is a stereoscopic display for providing separate images to each eye of the user. In some examples, the known orientation and position of display 203 relative to the front rigid body of HMD 112 is used as a frame of reference, also referred to as a local origin, when tracking the position and orientation of HMD 112 for rendering artificial reality content according to a current viewing perspective of HMD 112 and the user. In other examples, HMD 112 may take the form of other wearable head mounted displays, such as glasses or goggles.

As further shown in FIG. 2A, in this example, HMD 112 further includes one or more motion sensors 206, such as one or more accelerometers (also referred to as inertial measurement units or "IMUs") that output data indicative of current acceleration of HMD 112, GPS sensors that output data indicative of a location of HMD 112, radar or sonar that output data indicative of distances of HMD 112 from various objects, or other sensors that provide indications of a location or orientation of HMD 112 or other objects within a physical environment. Moreover, HMD 112 may include integrated image capture devices 138A and 138B (collectively, "image capture devices 138"), such as video cameras, laser scanners, Doppler radar scanners, depth scanners, or the like, configured to output image data representative of the physical environment. More specifically, image capture devices 138 capture image data representative of objects (including peripheral device 136 and/or hand 132) in the physical environment that are within a field of view 130A, 130B of image capture devices 138, which typically corresponds with the viewing perspective of HMD 112. HMD 112 includes an internal control unit 210, which may include an internal power source and one or more printed-circuit boards having one or more processors, memory, and hardware to provide an operating environment for executing programmable operations to process sensed data and present artificial reality content on display 203.

Figure 2B:
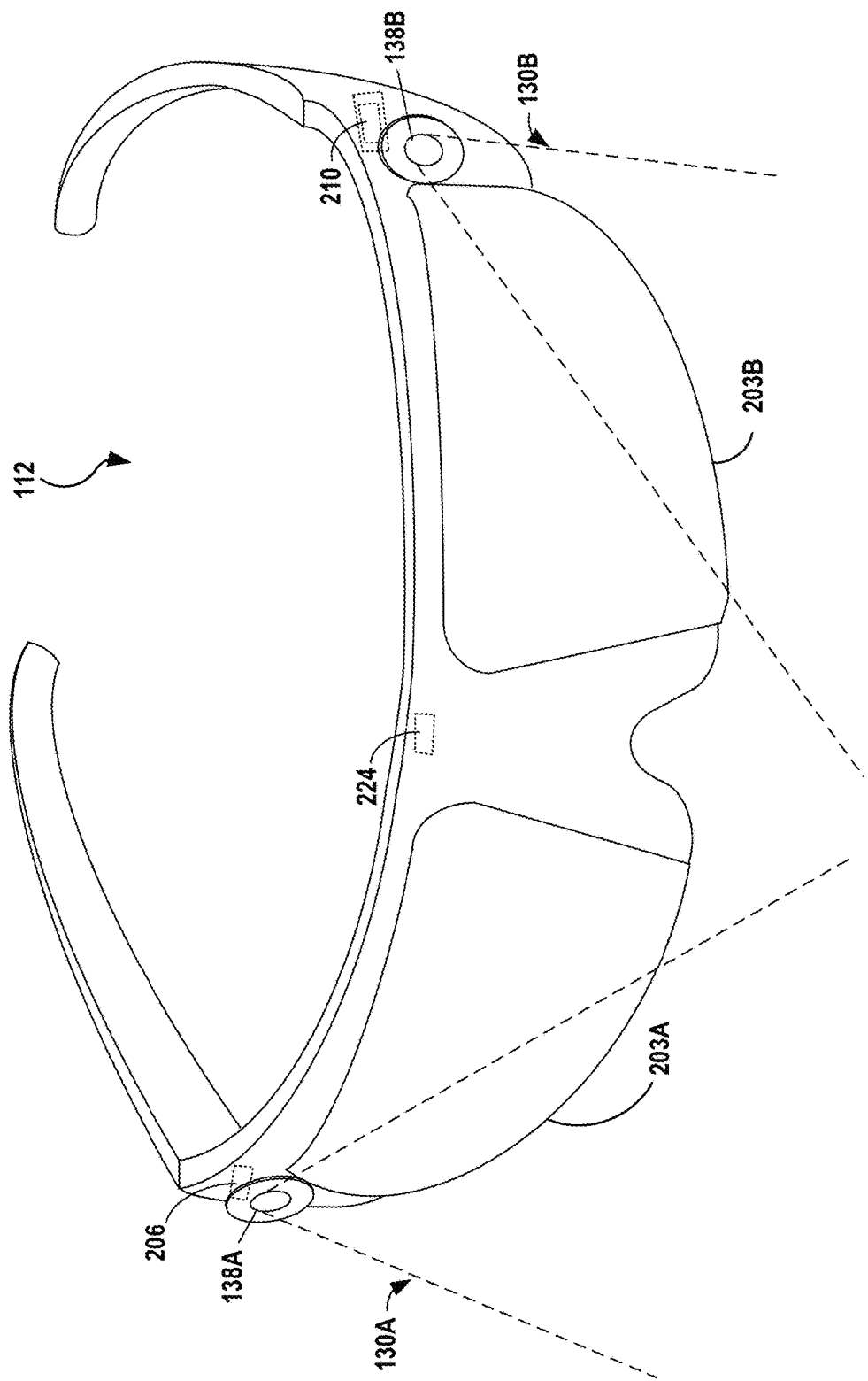
FIG. 2B is an illustration depicting another example HMD in which one or more SoC integrated circuits are configured to reduce SRAM power leakage, in accordance with techniques described in this disclosure.

FIG. 2B is an illustration depicting another example HMD 112, in which one or more SoC integrated circuits are configured to reduce SRAM power leakage in accordance with one or more techniques of this disclosure. FIG. 2B illustrates an HMD 112 having a glasses form factor. HMD 112 of FIG. 2B may be an example of any of HMDs 112 of FIGS. 1A and 1B. HMD 112 may be part of an artificial reality system, such as artificial reality systems 10, 20 of FIGS. 1A, 1B, or may operate as a stand-alone, mobile artificial realty system configured to implement the techniques described herein. HMD 112 of FIG. 2B may communicate with a peripheral device (not shown in FIG. 2B).

In this example, HMD 112 are glasses comprising a front frame including a bridge to allow the HMD 112 to rest on a user's nose and temples (or "arms") that extend over the user's ears to secure HMD 112 to the user. In addition, HMD 112 of FIG. 2B includes interior-facing electronic displays 203A and 203B (collectively, "electronic displays 203") configured to present artificial reality content to the user. Electronic displays 203 may be any suitable display technology, such as liquid crystal displays (LCD), quantum dot display, dot matrix displays, light emitting diode (LED) displays, organic light-emitting diode (OLED) displays, cathode ray tube (CRT) displays, e-ink, or monochrome, color, or any other type of display capable of generating visual output. In the example shown in FIG. 2B, electronic displays 203 form a stereoscopic display for providing separate images to each eye of the user. In some examples, the known orientation and position of display 203 relative to the front frame of HMD 112 is used as a frame of reference, also referred to as a local origin, when tracking the position and orientation of HMD 112 for rendering artificial reality content according to a current viewing perspective of HMD 112 and the user.

As further shown in FIG. 2B, in this example, HMD 112 further includes one or more motion sensors 206, such as one or more accelerometers (also referred to as inertial measurement units or "IMUS") that output data indicative of current acceleration of HMD 112, GPS sensors that output data indicative of a location of HMD 112, radar or sonar that output data indicative of distances of HMD 112 from various objects, or other sensors that provide indications of a location or orientation of HMD 112 or other objects within a physical environment. Moreover, HMD 112 may include integrated image capture devices 138A and 138B (collectively, "image capture devices 138"), such as video cameras, laser scanners, Doppler radar scanners, depth scanners, or the like, configured to output image data representative of the physical environment. HMD 112 includes an internal control unit 210, which may include an internal power source and one or more printed-circuit boards having one or more processors, memory, and hardware to provide an operating environment for executing programmable operations to process sensed data and present artificial reality content on display 203.

In accordance with one or more techniques of this disclosure, example HMDs 112 of FIGS. 2A and 2B include one or more SoC integrated circuits configured to reduce SRAM power leakage in accordance with one or more techniques of this disclosure. Various low power devices, such as example HMDs 112, may benefit from the reduced power consumption and corresponding reduction in size and weight provided by the SRAM power leakage reduction techniques of this disclosure. For example, a reduction of SRAM power leakage may result in lower overall power consumption by the device and, as a result, a reduction in the amount of power required to operate the device. Due to these reduced power requirements, the device may be powered using smaller battery sizes (smaller in terms of the amount of power provided, the physical dimensions and/or the weight), leading to a corresponding reduction in the size and/or weight of the device. This may further lead to increased comfort for the wearer and a more fully immersive and realistic AR experience. In addition to AR systems, the techniques of this disclosure may also provide similar advantages for low-power devices in other applications, and the disclosure is not limited in this respect. For example, the techniques of this disclosure may be advantageous for low-power devices in many other applications such as autonomous driving, edge-based artificial intelligence, Internet-of-Things, and other applications which may benefit from reduced power consumption and a reduction in size and/or weight.

Figure 3:
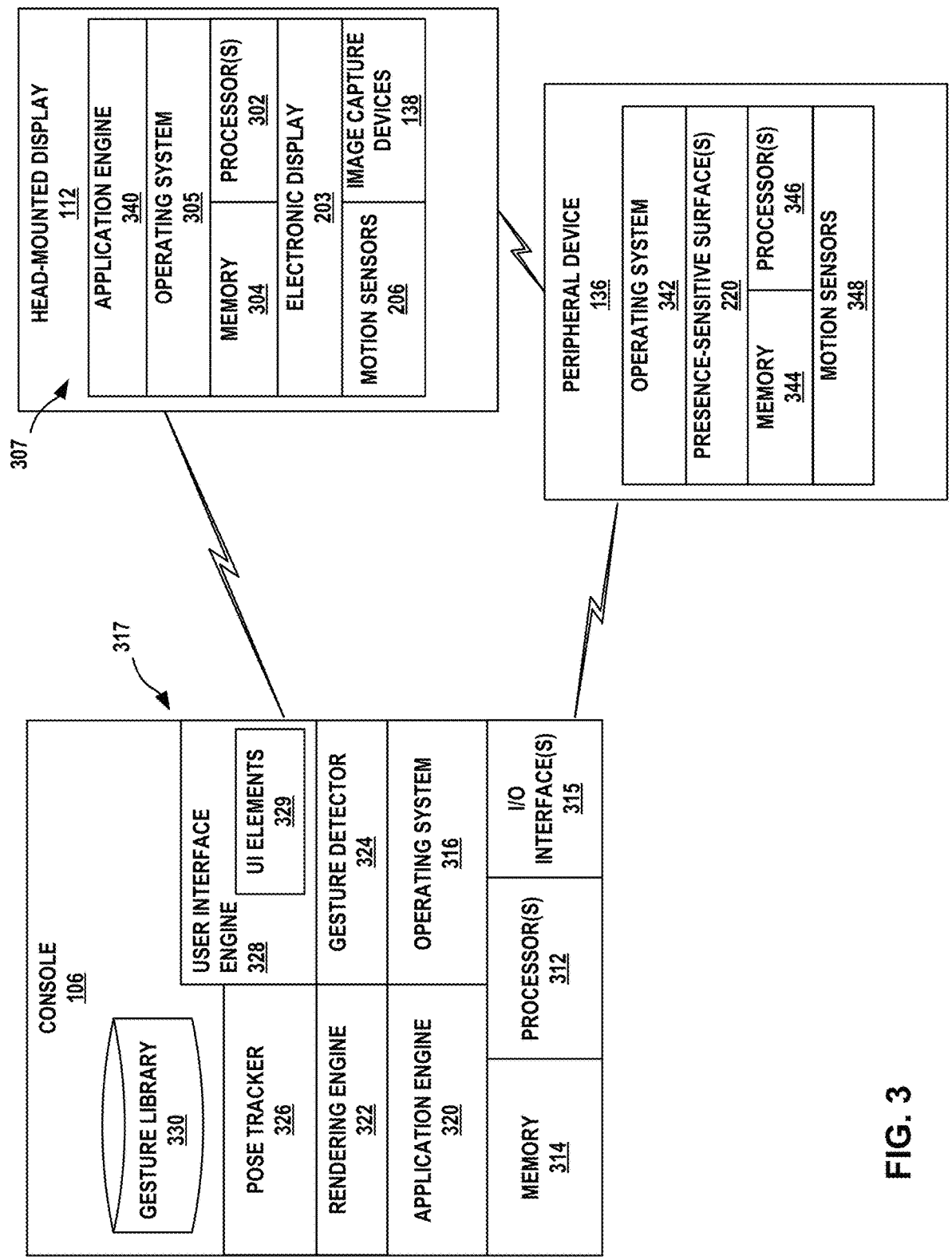
FIG. 3 is a block diagram showing example implementations of a console, an HMD, and a peripheral device of the multi-device artificial reality systems of FIGS. 1A, 1B, in which one or more SoC integrated circuits are configured to reduce SRAM power leakage in accordance with techniques described in this disclosure.

FIG. 3 is a block diagram showing example implementations of console 106, HMD 112, and peripheral device 136 of multi-device artificial reality system 10, 20 of FIGS. 1A, 1B, in which one or more SoC integrated circuits are configured to reduce SRAM power leakage in accordance with one or more techniques of this disclosure. For example, console 106, HMD 112, and/or peripheral device 136 may each include one or more SoC integrated circuits configured to reduce SRAM power leakage in accordance with one or more techniques of this disclosure.

In the example of FIG. 3, console 106 performs pose tracking, gesture detection, and rendering for HMD 112 based on sensed data, such as motion data and image data received from HMD 112 and/or external sensors.

In this example, HMD 112 includes one or more processors 302 and memory 304 that, in some examples, provide a computer platform for executing an operating system 305, which may be an embedded, real-time multitasking operating system, for instance, or other type of operating system. In turn, operating system 305 provides a multitasking operating environment for executing one or more software components 307, including application engine 340. As discussed with respect to the examples of FIGS. 2A and 2B, processors 302 are coupled to electronic display 203, motion sensors 206 and image capture devices 138. In some examples, processors 302 and memory 304 may be separate, discrete components. In other examples, memory 304 may be on-chip memory collocated with processors 302 within a single integrated circuit. As discussed with respect to the example of FIGS. 2A and 2B, processors 302 include a security processor 224 to provide secure device attestation and mutual authentication of HMD 112 when pairing with devices, e.g., peripheral device 136, used in conjunction within the AR environment. Each of software components 307 and processes executed by HMD 112 may have a different software identifier. Processes executed by processors of peripheral device 136 may also have different software identifiers. Software identifiers for processes may be unique among processes executed by any device of the artificial reality system 10.

In general, console 106 is a computing device that processes image and tracking information received from cameras 102 (FIG. 1B) and/or image capture devices 138 HMD 112 (FIGS. 1A, 2A, 2B) to perform gesture detection and user interface and/or virtual content generation for HMD 112. In some examples, console 106 is a single computing device, such as a workstation, a desktop computer, a laptop, or gaming system. In some examples, at least a portion of console 106, such as processors 312 and/or memory 314, may be distributed across a cloud computing system, a data center, or across a network, such as the Internet, another public or private communications network, for instance, broadband, cellular, Wi-Fi, and/or other types of communication networks for transmitting data between computing systems, servers, and computing devices.

In the example of FIG. 3, console 106 includes one or more processors 312 and memory 314 that, in some examples, provide a computer platform for executing an operating system 316, which may be an embedded, real-time multitasking operating system, for instance, or other type of operating system. In turn, operating system 316 provides a multitasking operating environment for executing one or more software components 317. Processors 312 are coupled to one or more I/O interfaces 315, which provides one or more I/O interfaces for communicating with external devices, such as a keyboard, game controllers, display devices, image capture devices, HMDs, peripheral devices, and the like. Moreover, the one or more I/O interfaces 315 may include one or more wired or wireless network interface controllers (NICs) for communicating with a network, such as network 104.

Software applications 317 of console 106 operate to provide an overall artificial reality application. In this example, software applications 317 include application engine 320, rendering engine 322, gesture detector 324, pose tracker 326, and user interface engine. Each of software applications 317 and other processes executed by console 106 may have a different software identifier.

In general, application engine 320 includes functionality to provide and present an artificial reality application, e.g., a teleconference application, a gaming application, a navigation application, an educational application, training or simulation applications, and the like. Application engine 320 may include, for example, one or more software packages, software libraries, hardware drivers, and/or Application Program Interfaces (APIs) for implementing an artificial reality application on console 106. Responsive to control by application engine 320, rendering engine 322 generates 3D artificial reality content for display to the user by application engine 340 of HMD 112.

Application engine 320 and rendering engine 322 construct the artificial content for display to user 110 in accordance with current pose information for a frame of reference, typically a viewing perspective of HMD 112, as determined by pose tracker 326. Based on the current viewing perspective, rendering engine 322 constructs the 3D, artificial reality content which may in some cases be overlaid, at least in part, upon the real-world 3D environment of user 110. During this process, pose tracker 326 operates on sensed data received from HMD 112, such as movement information and user commands, and, in some examples, data from any external sensors 90 (FIGS. 1A, 1B), such as external cameras, to capture 3D information within the real-world environment, such as motion by user 110 and/or feature tracking information with respect to user 110. Based on the sensed data, pose tracker 326 determines a current pose for the frame of reference of HMD 112 and, in accordance with the current pose, constructs the artificial reality content for communication, via the one or more I/O interfaces 315, to HMD 112 for display to user 110.

Pose tracker 326 may determine a current pose for peripheral device 136 and/or HMD 112. User interface engine 328 is configured to generate virtual user interfaces for rendering at HMD 112 in an artificial reality environment. User interface engine 328 may generate a virtual user interface to include one or more virtual user interface elements 329, such as a virtual drawing interface, a selectable menu (e.g., drop-down menu), virtual buttons, a directional pad, a keyboard, or other user-selectable user interface elements, glyphs, display elements, content, user interface controls, and so forth. Rendering engine 322 is configured to render virtual user interface and other artificial reality content for display at HMD 112 in the artificial reality environment.

Console 106 may output artificial reality content, via a communication channel, to HMD 112 for display at HMD 112. Rendering engine 322 may receive pose information for HMD 112 and/or peripheral device 136 to update the pose rendering of artificial reality content to the pose.

Based on the sensed data from any of the image capture devices 138 or 102, presence-sensitive surfaces 220, or other sensor devices, gesture detector 324 analyzes the tracked motions, configurations, positions, and/or orientations of peripheral device 136 and/or objects (e.g., hands, arms, wrists, fingers, palms, thumbs) of the user to identify one or more gestures performed by user 110. More specifically, gesture detector 324 analyzes objects recognized within image data captured by image capture devices 138 of HMD 112 and/or sensors 90 and external cameras 102 to identify peripheral device 136 and/or a hand and/or arm of user 110, and track movements of the peripheral device 136, hand, and/or arm relative to HMD 112 to identify gestures performed by user 110. In some examples, gesture detector 324 may track movement, including changes to position and orientation, of the peripheral device 136, hand, digits, and/or arm based on the captured image data, and compare motion vectors of the objects to one or more entries in gesture library 330 to detect a gesture or combination of gestures performed by user 110. In some examples, gesture detector 324 may receive user inputs detected by presence-sensitive surface(s) of peripheral device and process the user inputs to detect one or more gestures performed by user 110 with respect to peripheral device 136.

Gesture detector 324 and gesture library 330 may be distributed, in whole or in part, to peripheral device 136 to process user inputs on peripheral device 136 to detect gestures. In such cases, presence-sensitive surface(s) 220 detects user inputs at locations of the surface. Peripheral device 136 executing gesture detector 324 can process the user inputs to detect one or more gestures of gesture library 330. Peripheral device 136 may send indications of the detected gestures to console 106 and/or HMD 112 to cause the console 106 and/or HMD 112 to responsively perform one or more actions. Peripheral device 136 may alternatively, or additionally, send indications of the user inputs at locations of the surface to console 106, and gesture detector 324 may process the user inputs to detect one or more gestures of gesture library 330.

Some entries in gesture library 330 may each define a gesture as a series or pattern of motion, such as a relative path or spatial translations and rotations of peripheral device 136, a user's hand, specific fingers, thumbs, wrists and/or arms. Some entries in gesture library 330 may each define a gesture as a configuration, position, and/or orientation of the peripheral device, user's hand and/or arms (or portions thereof) at a particular time, or over a period of time. Some entries in gesture library 330 may each define a gesture as one or more user inputs, over time, detected by presence-sensitive surface(s) 220 of peripheral device 136. Other examples of type of gestures are possible. In addition, each of the entries in gesture library 330 may specify, for the defined gesture or series of gestures, conditions that are required for the gesture or series of gestures to trigger an action, such as spatial relationships to a current field of view of HMD 112, spatial relationships to the particular region currently being observed by the user, as may be determined by real-time gaze tracking of the individual, types of artificial content being displayed, types of applications being executed, and the like.

Each of the entries in gesture library 330 further may specify, for each of the defined gestures or combinations/series of gestures, a desired response or action to be performed by software applications 317. For example, certain specialized gestures may be pre-defined such that, in response to detecting one of the pre-defined gestures, user interface engine 328 dynamically generates a user interface as an overlay to artificial reality content being displayed to the user, thereby allowing the user 110 to easily invoke a user interface for configuring HMD 112 and/or console 106 even while interacting with artificial reality content. In other examples, certain gestures may be associated with other actions, such as providing input, selecting virtual objects (including virtual content items and/or UI elements), translating (e.g., moving, rotating) virtual objects, altering (e.g., scaling, annotating) virtual objects, making virtual markings, launching applications, and the like.

As an example, gesture library 330 may include entries that describe a peripheral device gesture, such as user interface activation gesture, a menu scrolling gesture, a selection gesture, a stamping gesture, a translation gesture, rotation gesture, drawing gesture, and/or pointing gesture. Gesture detector 324 may process image data from image capture devices 138 to analyze configurations, positions, motions, and/or orientations of peripheral device 136 and/or a user's hand to identify a user interface gesture, selection gesture, stamping gesture, translation gesture, rotation gesture, drawing gesture, pointing gesture, etc. that may be performed by users with respect to peripheral device 136. For example, the rendering engine 322 can render a pinboard user interface based on detecting, by the gesture detector 324, of the user interface gesture being performed and detecting, by the pose tracker 326, that the HMD 112 is proximate to a physical position corresponding to a virtual position of the virtual pinboard. The user interface engine 328 can define the menu that is displayed and can control actions that are performed in response to selections caused by selection gestures.

In the example shown in FIG. 3, peripheral device 136 includes one or more processors 346 and memory 344 that, in some examples, provide a computer platform for executing an operating system 342, which may be an embedded, real-time multitasking operating system, for instance, or other type of operating system. In turn, operating system 346 provides a multitasking operating environment for executing one or more software components. In some examples, peripheral device 136 includes one or more presence-sensitive surfaces 220 (e.g., one or more surfaces that use capacitive, conductive, resistive, acoustic, and/or other technology to detect touch and/or hover input). In one or more aspects, peripheral device 136 can be configured to detect touch and/or hover input at presence-sensitive surface 220, process that input (e.g., at processors 346) and communicate the touch and/or hover input and communicate information about that input (including location information about that input) to console 106 and/or HMD 112. As discussed with respect to the example of FIG. 2A, presence-sensitive surface(s) 220 can comprise a touchscreen (e.g., a capacitive touchscreen, resistive touchscreen, surface acoustic wave (SAW) touchscreen, infrared touchscreen, optical imaging touchscreen, acoustic pulse recognition touchscreen, or any other touchscreen). As further shown in FIG. 3, in this example, peripheral device 136 further includes one or more motion sensors 348, such as one or more accelerometers (also referred to as IMUs) that output data indicative of current acceleration of peripheral device 136, GPS sensors that output data indicative of a location or position of peripheral device, radar or sonar that output data indicative of distances of peripheral device 136 from various objects (e.g., from a wall or other surface), or other sensors that provide indications of a location, position, and/or orientation of peripheral device or other objects within a physical environment. In some examples, processors 346 are coupled to presence-sensitive surface(s) 220 and motion sensors 246. In some examples, processors 346 and memory 344 may be separate, discrete components. In other examples, memory 344 may be on-chip memory collocated with processors 346 within a single integrated circuit. In one or more aspects, peripheral device 136 can coexist with the HMD and, in some examples, operate as an auxiliary input/output device for the HMD in the virtual environment. In some examples, the peripheral device 136 may operate as an artificial reality co-processing device to which some of the functions of the HMD are offloaded. In one or more aspects, peripheral device 136 can be a smartphone, tablet, or other hand-held device.

In some examples, each of processors 302, 312, 346 may comprise any one or more of a multi-core processor, a controller, a digital signal processor (DSP), an application specific integrated circuit (ASIC), a field-programmable gate array (FPGA), or equivalent discrete or integrated logic circuitry. Memory 304, 314, 344 may comprise any form of memory for storing data and executable software instructions, such as random-access memory (RAM), read only memory (ROM), programmable read only memory (PROM), erasable programmable read only memory (EPROM), electronically erasable programmable read only memory (EEPROM), and flash memory.

Figure 4:
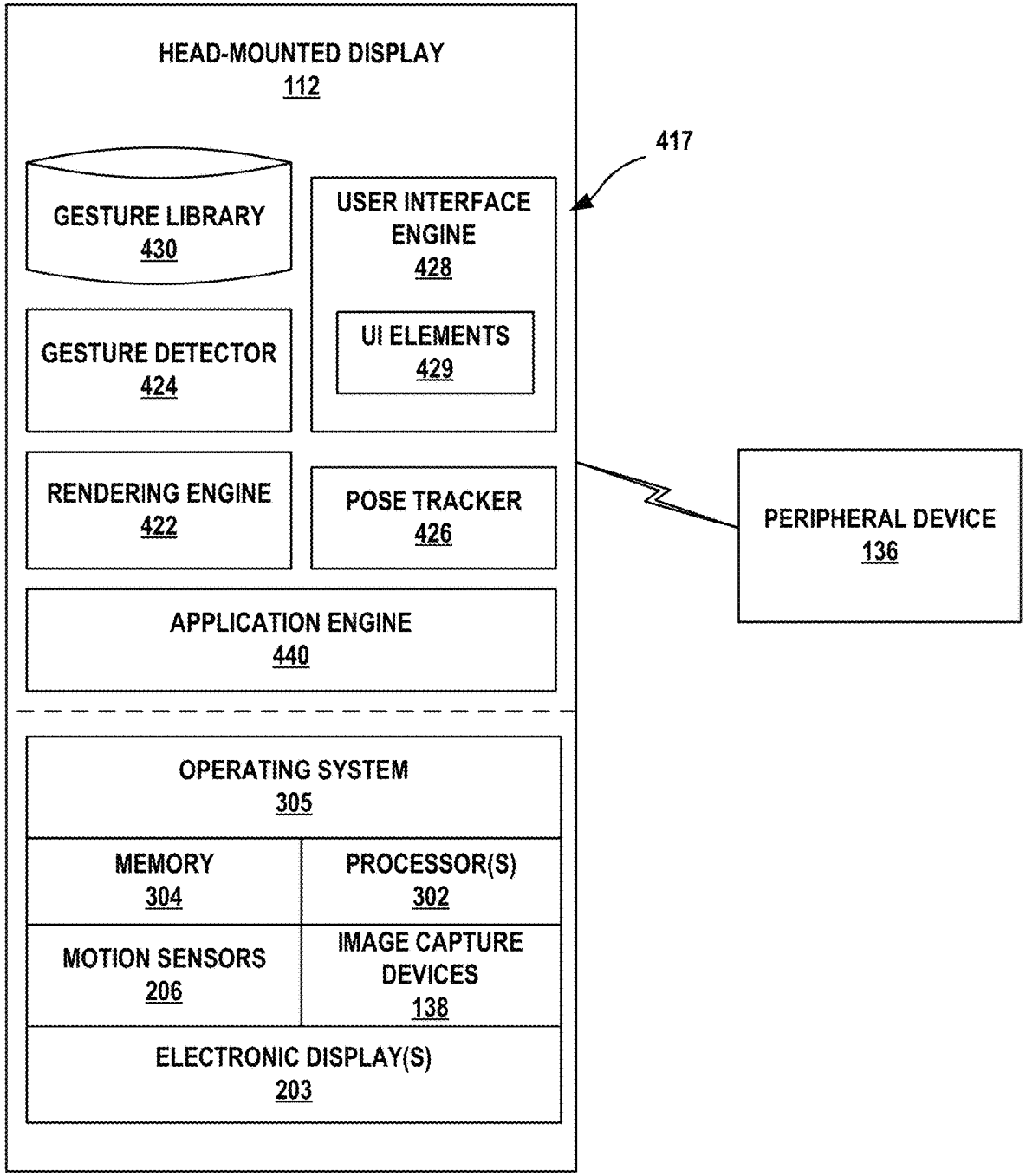
FIG. 4 is a block diagram showing an example implementation of an HMD and a peripheral device of the artificial reality systems of FIGS. 1A, 1B, in which one or more SoC integrated circuits are configured to reduce SRAM power leakage in accordance with one or more techniques described in this disclosure.

FIG. 4 is a block diagram of an example implementation of an HMD 112, and a peripheral device 136 of the artificial reality systems of FIGS. 1A, 1B, in which one or more SoC integrated circuits are configured to reduce SRAM power leakage in accordance with one or more techniques of this disclosure.

In this example, similar to FIG. 3, HMD 112 includes one or more processors 302 and memory 304 that, in some examples, provide a computer platform for executing an operating system 305, which may be an embedded, real-time multitasking operating system, for instance, or other type of operating system. In turn, operating system 305 provides a multitasking operating environment for executing one or more software components 417. Moreover, processor(s) 302 are coupled to electronic display 203, motion sensors 206, and image capture devices 138.

In the example of FIG. 4, software components 417 operate to provide an overall artificial reality application. In this example, software applications 417 include application engine 440, rendering engine 422, gesture detector 424, pose tracker 426, and user interface engine 428. In various examples, software components 417 operate similar to the counterpart components of console 106 of FIG. 3 (e.g., application engine 320, rendering engine 322, gesture detector 324, pose tracker 326, and user interface engine 328) to construct virtual user interfaces overlaid on, or as part of, the artificial content for display to user 110.

Similar to the examples described with respect to FIG. 3, based on the sensed data from any of the image capture devices 138 or 102, presence-sensitive surfaces of peripheral device 136, or other sensor devices, gesture detector 424 analyzes the tracked motions, configurations, positions, and/or orientations of peripheral device 136 and/or objects (e.g., hands, arms, wrists, fingers, palms, thumbs) of the user to identify one or more gestures performed by user 110.

More specifically, gesture detector 424 may analyze objects recognized within image data captured by image capture devices 138 of HMD 112 and/or sensors 90 and external cameras 102 to identify peripheral device 136 and/or a hand and/or arm of user 110, and track movements of the peripheral device 136, hand, and/or arm relative to HMD 112 to identify gestures performed by user 110. Gesture detector 424 may analyze objects recognized within image data captured by image capture devices 138 of HMD 112 and/or sensors 90 and external cameras 102 to identify peripheral device 136 and/or a hand and/or arm of user 110, and track movements of the peripheral device 136, hand, and/or arm relative to HMD 112 to identify gestures performed by user 110. In some examples, gesture detector 424 may track movement, including changes to position and orientation, of the peripheral device 136, hand, digits, and/or arm based on the captured image data, and compare motion vectors of the objects to one or more entries in gesture library 430 to detect a gesture or combination of gestures performed by user 110. In some examples, gesture detector 424 may receive user inputs detected by presence-sensitive surface(s) of peripheral device and process the user inputs to detect one or more gestures performed by user 110 with respect to peripheral device 136. Gesture library 430 is similar to gesture library 330 of FIG. 3. Some of all of the functionality of gesture detector 424 may be executed by peripheral device 136.

In accordance with one or more techniques described herein, the multi-device artificial reality systems of FIGS. 3 and 4 include one or more SoC integrated circuits configured to reduce SRAM power leakage. For example, as discussed in greater detail herein, HMD 112, console 106 and/or peripheral device 136 may each include one or more SoC integrated circuits configured to reduce SRAM power leakage.

Various low power devices, such as HMDs 112 and/or peripheral devices 136 as shown in FIGS. 3 and 4, may benefit from the reduced power consumption and corresponding reduction in size and weight provided by the SRAM power leakage reduction techniques of this disclosure. For example, a reduction of SRAM power leakage may result in lower overall power consumption by the device and, as a result, a reduction in the amount of power required to operate the device. Due to these reduced power requirements, the device may be powered using smaller battery sizes (smaller in terms of the amount of power provided, the physical dimensions and/or the weight), leading to a corresponding reduction in the size and/or weight of the device. This may further lead to increased comfort for the wearer and a more fully immersive and realistic AR experience. In addition to AR systems, the techniques of this disclosure may also provide similar advantages for low-power devices in other applications, and the disclosure is not limited in this respect. For example, the techniques of this disclosure may be advantageous for low-power devices in many other applications such as autonomous driving, edge-based artificial intelligence, Internet-of-Things, and other applications which may benefit from reduced power consumption and a reduction in size and/or weight.

Figure 5:
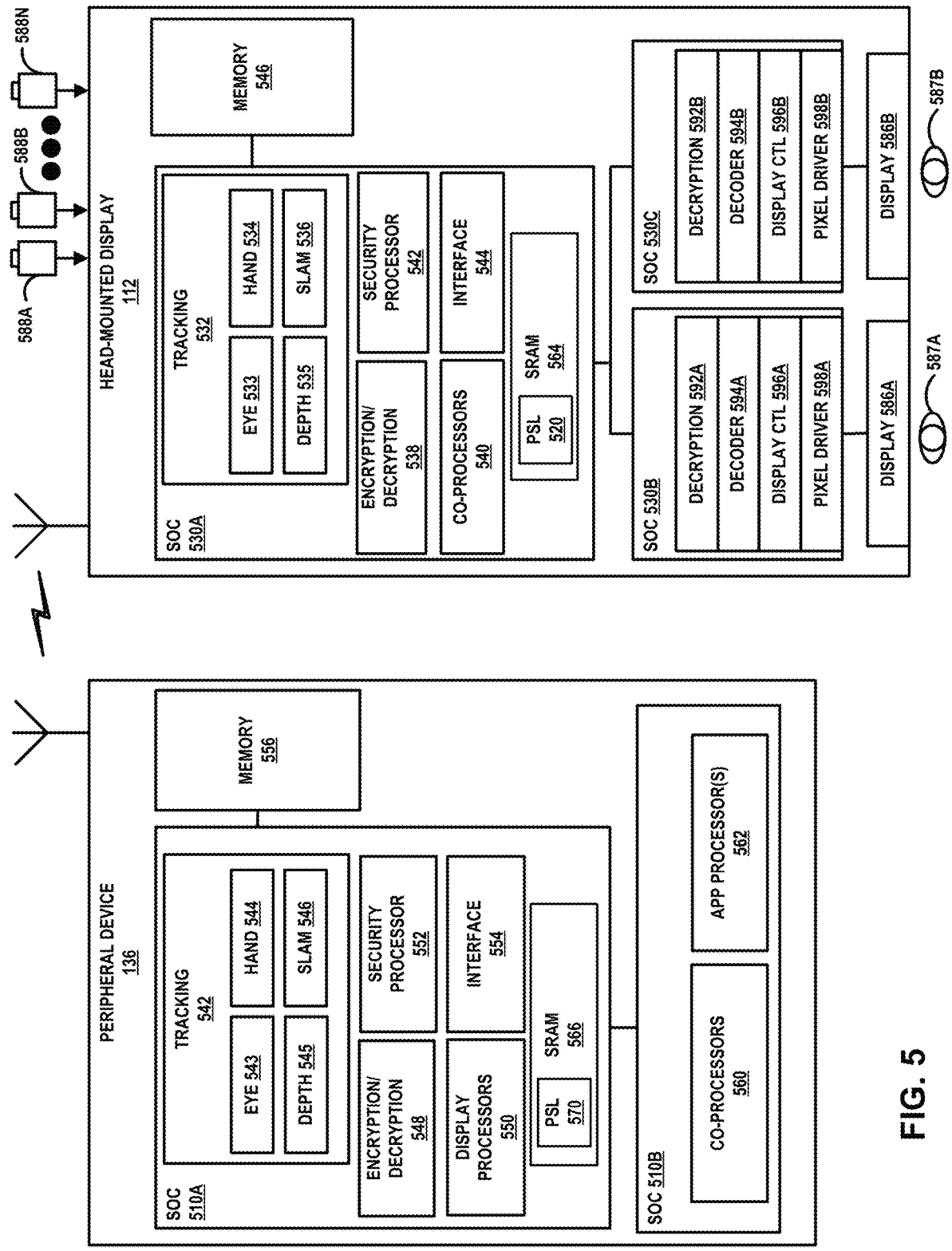
FIG. 5 is a block diagram illustrating an example implementation of a distributed architecture for a multi-device artificial reality system in which one or more SoC integrated circuits are configured to reduce SRAM power leakage in accordance with one or more techniques described in this disclosure.

FIG. 5 is a block diagram illustrating a more detailed example implementation of a distributed architecture for a multi-device artificial reality system in which one or more SoC integrated circuits are configured to reduce SRAM power leakage in accordance with one or more techniques of this disclosure. FIG. 5 illustrates an example in which HMD 112 operates in conjunction with peripheral device 136. HMD 112 and/or peripheral device 136 may each include one or more SoC integrated circuits configured to reduce SRAM power leakage in accordance with one or more techniques of this disclosure.

Peripheral device 136 represents a physical, real-world device having a surface on which multi-device artificial reality systems, such as systems 100, overlays virtual content. Peripheral device 136 may include an interface 554 having one or more presence-sensitive surface(s) for detecting user inputs by detecting a presence of one or more objects (e.g., fingers, stylus, etc.) touching or hovering over locations of presence-sensitive surfaces. In some examples, peripheral device 136 may have a form factor similar to any of a smartphone, a tablet computer, a personal digital assistant (PDA), or other hand-held device. In other examples, peripheral device 136 may have the form factor of a smartwatch, a so-called "smart ring," or other wearable device. Peripheral device 136 may also be part of a kiosk or other stationary or mobile system. Interface 554 may incorporate output components, such as one or more display device(s), for outputting visual content to a screen. As described above, HMD 112 is architected and configured to enable the execution of artificial reality applications.

In this example, HMD 112 and peripheral device 136 include SoCs 530, 510, respectively, that represent a collection of specialized integrated circuits arranged in a distributed architecture and configured to provide an operating environment for artificial reality applications. As examples, SoC integrated circuits may include specialized functional blocks operating as co-application processors, sensor aggregators, encryption/decryption engines, security processors, hand/eye/depth tracking and pose computation elements, video encoding and rendering engines, display controllers and communication control components. FIG. 5 is merely one example arrangement of SoC integrated circuits. The distributed architecture for a multi-device artificial reality system may include any collection and/or arrangement of SoC integrated circuits.

In the example of FIG. 5, HMD 112 includes SoC 530A including an on-die SRAM 564 and external (off-die) non-volatile memory 546. Peripheral device 136 includes SoC 510A including an on-die SRAM 566 and external non-volatile local memory 556. In accordance with one or more techniques of this disclosure, either one or both of SoC integrated circuits 530A and/or 510A are configured to reduce SRAM power leakage. In addition, any one or more of SoCs 510B, 530B and/or 530C may also be configured to reduce SRAM power leakage in accordance with one or more techniques of this disclosure. In general, any SoC that employs SRAM-based memory structures may benefit from the SRAM power leakage reduction techniques of this disclosure.

SRAM 564 and SRAM 566 each include an array of SRAM bitcells and on-chip periphery logic. The periphery logic controls read/write functions and includes, for example, address logic for the selection of appropriate rows and columns, clock circuitry to control the timing of the read and write operations, write logic, control logic, etc. In accordance with one or more techniques of this disclosure, one or both of SRAMs 564, 566 include on-chip power switching logic (PSL) 520, 570, respectively, configured to switch the respective SRAM array between an "active" state in which a first, relatively higher voltage is supplied to the SRAM array and a "deep retention" state in which a second, relatively lower voltage is supplied to the SRAM array and in which SRAM power leakage is reduced as compared to the active state.

Various devices used in AR systems as described herein, such as head-mounted displays (e.g., any of HMDs 112), and/or peripheral devices (e.g., any of peripheral devices 136) as shown in FIG. 5, may benefit from the reduced power consumption and corresponding reduction in size and weight provided by the SRAM power leakage reduction techniques of this disclosure. For example, a reduction of SRAM power leakage for HMD 112 and/or peripheral device 136 may result in lower overall power consumption by the respective device and, as a result, a reduction in the amount of power required to operate the device. Due to these reduced power requirements, the devices may be powered using smaller battery sizes (smaller in terms of the amount of power provided, the physical dimensions and/or the weight), leading to a corresponding reduction in the size and/or weight of the device. This may further lead to increased comfort for the wearer and a more fully immersive and realistic AR experience. In addition to AR systems, the techniques of this disclosure may also provide similar advantages for low-power devices in other applications, and the disclosure is not limited in this respect. For example, the techniques of this disclosure may be advantageous for low-power devices in many other applications such as autonomous driving, edge-based artificial intelligence, Internet-of-Things, and other applications which may benefit from reduced power consumption and a reduction in size and/or weight.

In this example, SoC 530A of HMD 112 comprises functional blocks including security processor 224, tracking 570, an encryption/decryption 580, co-processors 582, and an interface 584. Tracking 570 provides a functional block for eye tracking 572 ("eye 572"), hand tracking 574 ("hand 574"), depth tracking 576 ("depth 576"), and/or Simultaneous Localization and Mapping (SLAM) 578 ("SLAM 578"). For example, HMD 112 may receive input from one or more accelerometers (also referred to as inertial measurement units or "IMUs") that output data indicative of current acceleration of HMD 112, GPS sensors that output data indicative of a location of HMD 112, radar or sonar that output data indicative of distances of HMD 112 from various objects, or other sensors that provide indications of a location or orientation of HMD 112 or other objects within a physical environment. HMD 112 may also receive image data from one or more image capture devices 588A-588N (collectively, "image capture devices 588"). Image capture devices may include video cameras, laser scanners, Doppler radar scanners, depth scanners, or the like, configured to output image data representative of the physical environment. More specifically, image capture devices capture image data representative of objects (including peripheral device 136 and/or hand) in the physical environment that are within a field of view of image capture devices, which typically corresponds with the viewing perspective of HMD 112. Based on the sensed data and/or image data, tracking 570 determines, for example, a current pose for the frame of reference of HMD 112 and, in accordance with the current pose, renders the artificial reality content.

Encryption/decryption 580 of SoC 530A is a functional block to encrypt outgoing data communicated to peripheral device 136 or a security server and decrypt incoming data communicated from peripheral device 136 or a security server. Co-application processors 582 includes one or more processors for executing instructions, such as a video processing unit, graphics processing unit, digital signal processors, encoders and/or decoders, and/or others.

Interface 584 of SoC 530A is a functional block that includes one or more interfaces for connecting to functional blocks of SoC 530B and/or 530C. As one example, interface 584 may include peripheral component interconnect express (PCIe) slots. SoC 530A may connect with SoC 530B, 530C using interface 584. SoC 530A may connect with a communication device (e.g., radio transmitter) using interface 584 for communicating with other devices, e.g., peripheral device 136.

SoCs 530B and 530C of HMD 112 each represents display controllers for outputting artificial reality content on respective displays, e.g., displays 586A, 586B (collectively, "displays 586"). In this example, SoC 530B may include a display controller for display 568A to output artificial reality content for a left eye 587A of a user. For example, SoC 530B includes a decryption block 592A, decoder block 594A, display controller 596A, and/or a pixel driver 598A for outputting artificial reality content on display 586A. Similarly, SoC 530C may include a display controller for display 568B to output artificial reality content for a right eye 587B of the user. For example, SoC 530C includes decryption 592B, decoder 594B, display controller 596B, and/or a pixel driver 598B for generating and outputting artificial reality content on display 586B. Displays 568 may include Light-Emitting Diode (LED) displays, Organic LEDs (OLEDs), Quantum dot LEDs (QLEDs), Electronic paper (E-ink) displays, Liquid Crystal Displays (LCDs), or other types of displays for displaying AR content.

In this example, peripheral device 136 includes SoCs 510A and 510B configured to support an artificial reality application. In this example, SoC 510A comprises functional blocks including security processor 552, tracking 542, an encryption/decryption 548, a display processor 550, and an interface 554. Tracking 542 is a functional block providing eye tracking 542 ("eye 543"), hand tracking 544 ("hand 544"), depth tracking 545 ("depth 545"), and/or Simultaneous Localization and Mapping (SLAM) 546 ("SLAM 546"). For example, peripheral device 136 may receive input from one or more accelerometers (also referred to as inertial measurement units or "IMUs") that output data indicative of current acceleration of peripheral device 136, GPS sensors that output data indicative of a location of peripheral device 136, radar or sonar that output data indicative of distances of peripheral device 136 from various objects, or other sensors that provide indications of a location or orientation of peripheral device 136 or other objects within a physical environment. Peripheral device 136 may in some examples also receive image data from one or more image capture devices, such as video cameras, laser scanners, Doppler radar scanners, depth scanners, or the like, configured to output image data representative of the physical environment. Based on the sensed data and/or image data, tracking block 542 determines, for example, a current pose for the frame of reference of peripheral device 136 and, in accordance with the current pose, renders the artificial reality content to HMD 112.

Encryption/decryption 548 of SoC 510A encrypts outgoing data communicated to HMD 112 or security server and decrypts incoming data communicated from HMD 112 or security server. Encryption/decryption 548 may support symmetric key cryptography to encrypt/decrypt data using a session key (e.g., secret symmetric key). Display processor 550 of SoC 510A includes one or more processors such as a video processing unit, graphics processing unit, encoders and/or decoders, and/or others, for rendering artificial reality content to HMD 112. Interface 554 of SoC 510A includes one or more interfaces for connecting to functional blocks of SoC 510A. As one example, interface 554 may include peripheral component interconnect express (PCIe) slots. SoC 510A may connect with SoC 510B using interface 554. SoC 510A may connect with one or more communication devices (e.g., radio transmitter) using interface 554 for communicating with other devices, e.g., HMD 112.

SoC 510B of peripheral device 136 includes co-application processors 560 and application processors 562. In this example, co-application processors 560 includes various processors, such as a vision processing unit (VPU), a graphics processing unit (GPU), and/or central processing unit (CPU). Application processors 562 may execute one or more artificial reality applications to, for instance, generate and render artificial reality content and/or to detect and interpret gestures performed by a user with respect to peripheral device 136.

Figure 6:
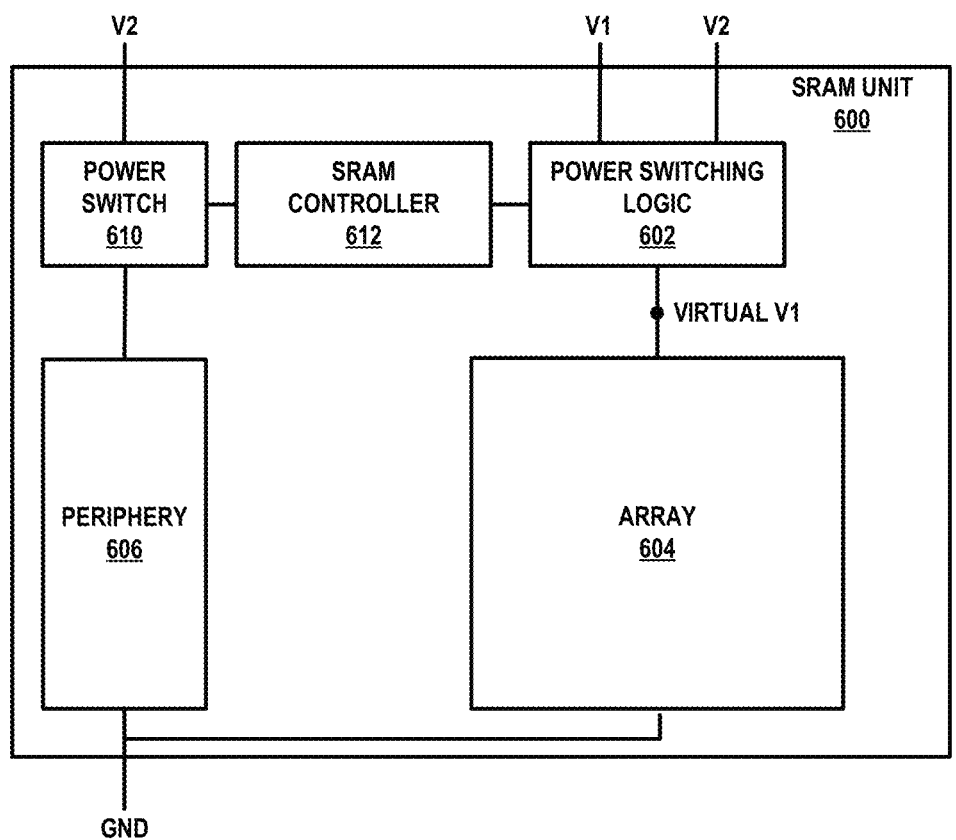
FIG. 6 is a block diagram illustrating an example SRAM unit configured to reduce SRAM power leakage in accordance with one or more techniques of this disclosure.

FIG. 6 is a block diagram illustrating an example SRAM unit 600 configured to reduce SRAM power leakage in accordance with one or more techniques of this disclosure. Example SRAM unit 600 may be used to implement SRAM 564 and/or SRAM 566 as part of SoCs 530A and 510A, respectively, as shown in FIG. 5. In addition, or alternatively, any of SoCs 510A-510B, 530A-530C, and/or any other SoC in an AR system may include an SRAM unit such as SRAM unit 600 configured to reduce SRAM power leakage.

SRAM unit 600 includes an SRAM bitcell array 604, periphery logic 606, power switch 610, power switching logic 602, and SRAM controller 612. Periphery logic 606 controls read/write functions of SRAM array 604 and includes, for example, address logic for row and column selection, timing logic, write logic, control logic, etc. In general, SRAM is a type of volatile memory in which data is lost when power is removed. SRAM array 604 requires at least a minimum data retention voltage to be applied in order to retain the data stored in the SRAM bitcells. In addition, SRAM array 604 also has an optimal operating voltage at which data read/write errors are minimized.

Two voltages, including a first, relatively higher voltage, V1, and a second, relatively lower logic voltage, V2, are supplied to SRAM unit 600. In some examples, these two voltages are supplied by two power supply rails on the SoC of which SRAM unit 600 forms a part. In accordance with one or more techniques of this disclosure, power switching logic 602 is supplied with V1 and V2 as inputs and is configured to output first voltage, V1, at output VIRTUAL_V1 when SRAM array 604 is in the active state, and is configured to output second voltage, V2, at output VIRTUAL_V1 when SRAM array 604 is in the deep retention state. In other words, power switching logic 602 is configured to switch the power supplied to SRAM array 604 between first voltage, V1, in the active state and second voltage, V2, in the deep retention state. SRAM controller 612 supplies one or more control signal(s) to power switching logic 602 that control whether the SRAM array is in the first active state or the deep retention state. In this example, SRAM controller 612 is embedded in each individual SRAM unit so that each individual SRAM unit can locally determine when to enter the deep retention state. In other examples, the control signals provided by SRAM controller 612 may be supplied by a centralized power management controller on an SoC, such as any one of SoCs 510A, 510B, 530A, 530B and/or 530C of FIG. 5.

In the active state, the second voltage, V2, is supplied to periphery logic 606 via power switch 610 and power switching logic 602 supplies the first voltage, V1, to SRAM array 604. In general, the bitcells of SRAM array 604 require a higher active operating voltage than the transistors of periphery logic 606, and therefore the first voltage, V1, is a relatively higher voltage than the second voltage, V2. In some example implementations, V1 may be 0.75V and V2 may be 0.6V. However, other voltages may also be used and the disclosure is not limited in this respect.

To switch from the active state to the deep retention state, power switch 610 disconnects periphery logic from supply voltage V2. In addition, in accordance with one or more techniques of this disclosure, power switching logic 602 switches the voltage supplied to SRAM array 604 at VIRTUAL_V1 from first voltage V1 to second voltage V2. Conversely, to switch from the deep retention state to the active state, power switch 610 connects periphery logic to supply voltage V2. In addition, power switching logic 602 switches the voltage supplied to SRAM array 604 at VIRTUAL_V1 from second voltage V2 to first voltage V1.

The techniques of this disclosure may provide one or more advantages. As the second voltage, V2, is lower than the first voltage, V1, SRAM power leakage in the deep retention state is reduced as compared to the SRAM power leakage in the active state. In addition, because the voltage rails supplying first voltage V1 and second voltage V2 are already present on the SoC and routed to SRAM unit 600, no additional supply voltages, voltage convertor circuitry, or supply line traces are required to supply a relatively lower voltage to the SRAM array for the deep retention state. This may further result in savings in surface area on the chip as compared to solutions in which additional supply voltages and/or voltage convertor circuitry is required. Further, the techniques of this disclosure provide advantages over so-called "diode-drop" solutions because power leakage resulting from the inherent resistance of a diode-drop circuit can significantly offset any power leakage savings in the SRAM array. For example, V2 may be provided by a voltage regulator circuit that is robust against process, voltage and temperature variation. V2 may be tightly controlled and in turn Virtual_V1 may be tightly controlled. For this reason, Virtual_V1 may be reduced to the minimum required voltage in the array. In contrast, if Virtual_V1 were to be generated by a diode-drop approach, there would be high variation in Virtual_V1 and thus the nominal Virtual_V1 value would need to be increased to margin for this variation. This margining consumes excess power.

As an example, Table 1 shows a comparison between three different SRAM retention state solutions: the first row includes example data when no retention state is used, the second row includes example data for the "diode-drop" approach, and third row includes example data for the "deep retention" state approach in accordance with one or more techniques of this disclosure. An example power leakage savings benefit for each SRAM IP core is shown in the second column and an example SoC level benefit is shown in the third column. As can been seen in Table 1, the deep retention state approach described in this disclosure provides the most power leakage saving benefit (e.g., 33% savings).

TABLE 1

| Retention State | Example Benefit IP-Level |
| --- | --- |
| No Special Retention for V1 | 60 uA * 0.75 V = 45 uW/64 kB Macro |
| Generate VIRT_V1 from V1 using 'diode-drop' approach | 50 uA * 0.75 V = 38 uW/64 kB Macro (−17%) (assuming diode drop to 0.6 V w/margining) |
| Connect VIRTUAL_V1 to V2 in "deep retention" state | 50 uA * 0.60 V = 30 uW/64 kB Macro (−33%) (assuming V2 = 0.6 V due to logic performance requirements) |

Figure 7:
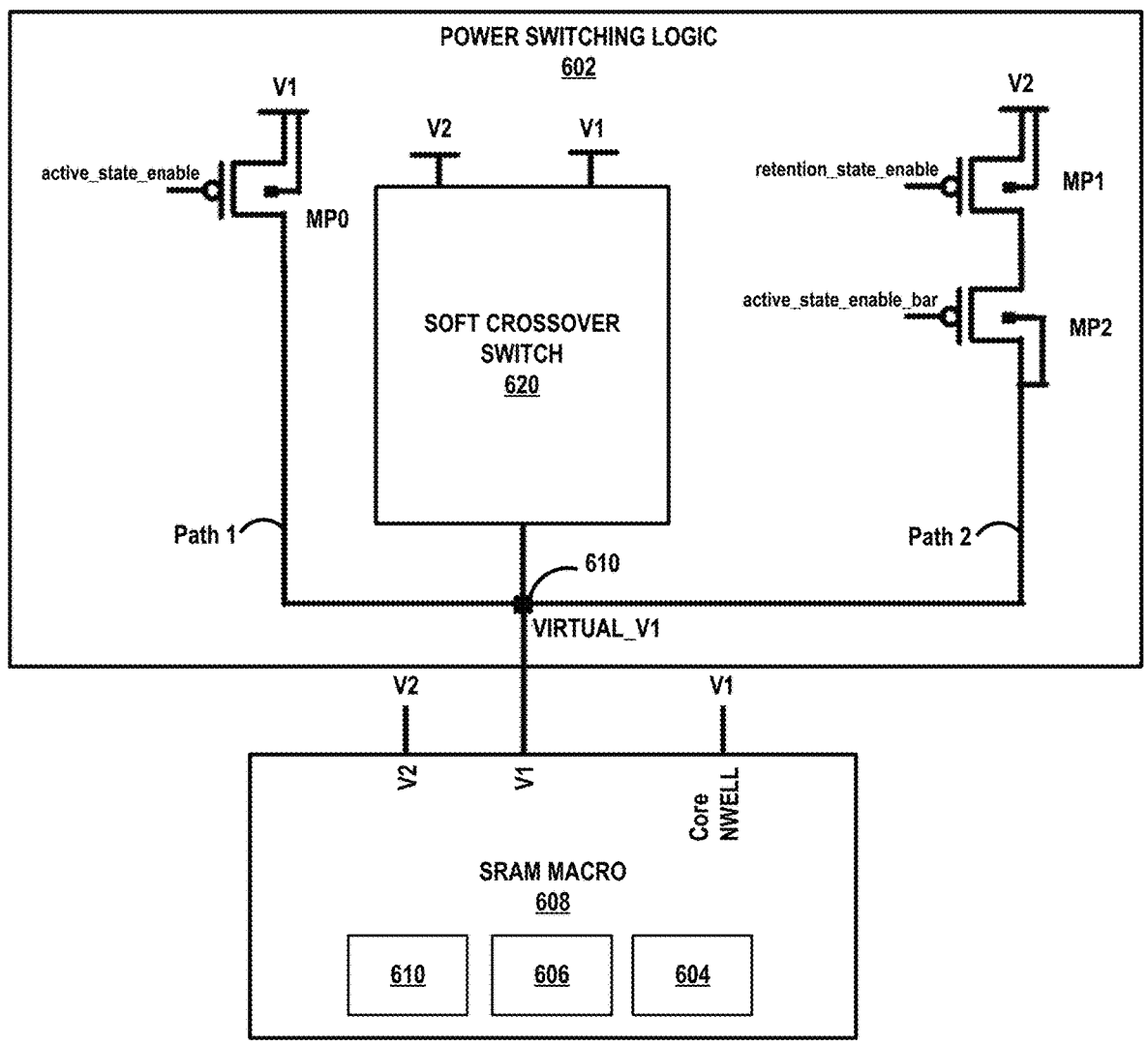
FIG. 7 is a diagram illustrating an example power switching logic configured to supply power to an SRAM macro including an SRAM bitcell array so as to reduce power leakage in the SRAM bitcell array in accordance with one or more techniques of this disclosure.

FIG. 7 is a diagram illustrating example power switching logic 602 in further detail. Power switching logic 602 is configured to supply power to an SRAM bitcell array so as to reduce power leakage in the SRAM bitcell array in accordance with one or more techniques of this disclosure.

In FIG. 7, an SRAM macro 608 includes SRAM bitcell array 604, periphery logic 606 and power switch 610 as shown in of FIG. 6.

First voltage, V1, and second voltage, V2, are supplied to SRAM macro 608 and also to power switching logic 602. In addition, the output of power switching logic 602 at node 610, VIRTUAL_V1, is also supplied to SRAM macro 608. In accordance with one or more techniques of this disclosure, power switching logic 602 is configured to output first voltage, V1, at output VIRTUAL_V1 when SRAM array 604 is in the active state, and is configured to output second voltage, V2, at output VIRTUAL_V1 when SRAM array 604 is in the deep retention state. In other words, power switching logic 602 is configured to switch the power supplied by voltage VIRTUAL_V1 to SRAM array 604 between first voltage, V1, in the active state and second voltage, V2, in the deep retention state.

Power switching logic 602 includes three power gating transistors: a first transistor MP0, a second transistor MP1 and a third transistor MP2. Each transistor MP0, MP1 and MP2 includes four terminals, a source terminal, a drain terminal, a gate (enable) terminal, and an n-well terminal. The source of transistor MP0 is connected to first voltage V1 and the source of transistor MP1 is connected to second voltage V2. The source of transistor MP2 is connected to the drain of transistor MP1. The drains of transistors MP0 and MP2 are tied together at an output node 610 of power switching logic 602 where the output voltage VIRT_V1 is supplied to SRAM macro 608. The n-well of transistor MP0 is tied to first voltage V1, the n-well of transistor MP1 is tied to second voltage V2, and the n-well of transistor MP2 is tied to output node 610.

A first control signal, active_state_enable, is supplied to the gate of transistor MP0, a second control signal, retention_state_enable, is supplied to the gate of transistor MP1, and a third control signal, active_state_enable bar is supplied to the gate of transistor MP2. The control signals active_state_enable and active_state_enable bar may be driven to be logical inverses of each other under normal operating conditions.

In some examples, the control signals active_state_enable, retention_state_enable, and active_state_enable bar are supplied by an SRAM controller embedded on each SRAM unit, such as SRAM controller 612 embedded on SRAM unit 600 as shown in FIG. 6. In other examples, the control signals are supplied by a centralized power management controller on an SoC, such as any one of SoCs 510A, 510B, 530A, 530B and/or 530C of FIG. 5.

Transistor MP0 provides a first path (indicated as "Path 1" in FIG. 7) that supplies first voltage, V1, at output node 610 during the active state. Transistors MP1 and MP2 provide a second path ("Path 2") to supply second voltage, V2, at output node 610 during the deep retention state.

Power switching logic 602 further includes soft crossover switch logic 620. Soft crossover switch logic is also supplied with first voltage V1 and second voltage V2 and includes an output tied to output node 610. Soft crossover switch logic 620 includes logic circuitry configured to prevent excessive voltage droop at VIRTUAL_V1 and excessive cross voltage domain noise injection or crowbar power during transitions between the active and deep retention states. Further details regarding soft crossover switch logic 620 are described herein with respect to FIGS. 10A-10B.

In operation, in the active state, the control signal "active_state_enable" turns on transistor MP0 such that output voltage VIRTUAL_V1 at output node 610 is equal to first voltage V1. The control signal active_state_enable bar is applied to the gate of transistor MP2. Because the drain of transistor MP2 is tied to output node 610, in the active state the output voltage VIRTUAL_V1 at output node 610 is equal to first voltage V1 and transistor MP2 is turned off. Transistor MP2 thus isolates transistor MP1 from VIRTUAL_V1 in the active state such that the n-well of transistor MP1 is not biased lower than the drain of transistor MP1.

In the deep retention state, the control signal "retention_state_enable" turns on transistor MP1 such that the output voltage VIRTUAL_V1 at output node 610 is equal to second voltage, V2.

As the second voltage, V2, is lower than the first voltage, V1, power leakage of the bitcells in SRAM array 604 in the deep retention state is reduced as compared to power leakage of the bitcells in SRAM array 604 in the active state. In addition, because the voltage rails supplying first voltage V1 and second voltage V2 are already present on the SoC and routed to SRAM unit 600, no additional supply voltages or voltage convertor circuitry is required to supply a relatively lower voltage for the deep retention state. This also results in a savings in surface area on the chip as compared to solutions in which additional supply voltages or voltages convertors are required. Further, the techniques of this disclosure provide advantages over so-called "diode drop" solutions because the power leakage resulting from the resistance of a diode drop circuit can significantly offset any power leakage savings in the SRAM array, whereas the relatively minimal logic used to implement power switching logic 602 does not significantly offset the power leakage savings in the SRAM array 604 when in the deep retention state. For example, V2 may be provided by a voltage regulator circuit that is robust against process, voltage and temperature variation. V2 may be tightly controlled and in turn Virtual_V1 may be tightly controlled. For this reason, Virtual_V1 may be reduced to the minimum required voltage in the array. In contrast, if Virtual_V1 were to be generated by a diode-drop approach, there would be high variation in Virtual_V1 and thus the nominal Virtual_V1 value would need to be increased to margin for this variation. This margining consumes excess power.

In accordance with one or more techniques of this disclosure, several factors are taken into account in the design of power switching logic 602 to ensure appropriate voltages are supplied to the SRAM array 604 and to the power gating transistors of power switching logic 602 during transitions between the active state and the deep retention state, and also during a cold system boot. For example, as described above with respect to FIG. 7, power switching logic 602 is configured to prevent forward biasing of MP0, MP1 and MP2 n-wells when VIRUTAL V1 transitions between V1 and V2 levels (that is, during entry to the deep retention state from the active state, and during exit from the deep retention state to the active state).

As another example, power switching logic 602 is configured to prevent forward biasing of the MP0, MP1 and MP2 n-wells during a cold system boot, when second voltage V2 reaches its peak before first voltage V1 reaches its peak (in other words, when second voltage V2 is valid but first voltage V1 is not yet valid). To provide this feature, power switching logic 602 includes power detector logic 650 (not shown in FIG. 7) as described herein with respect to FIGS. 8A-8C and 9. For example, an output of the power detector logic 650 may be used to de-assert the retention_state_enable signal during a cold system boot to prevent forwarding biasing of the MP0, MP1, MP2 and SRAM macro n-wells.

As another example, power switching logic 602 is configured to minimize crowbar power and noise between V1 and V2 during transitions between the active state and the deep retention state, and is further configured to minimize voltage droop of VIRTUAL_V1 below second voltage V2 during transitions between the active state and the deep retention state. To provide these features, power switching logic 602 includes soft crossover switch 620 as described herein with respect to FIGS. 10A-10B.

Figure 8A:
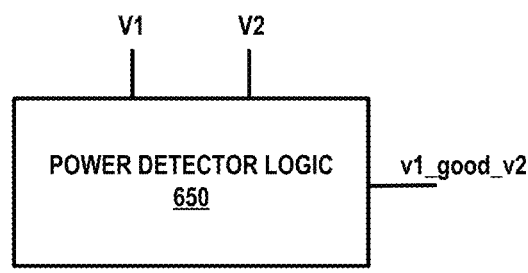
FIG. 8A is a diagram illustrating an example power detector in accordance with one or more techniques of this disclosure in further detail.
Figure 8B:
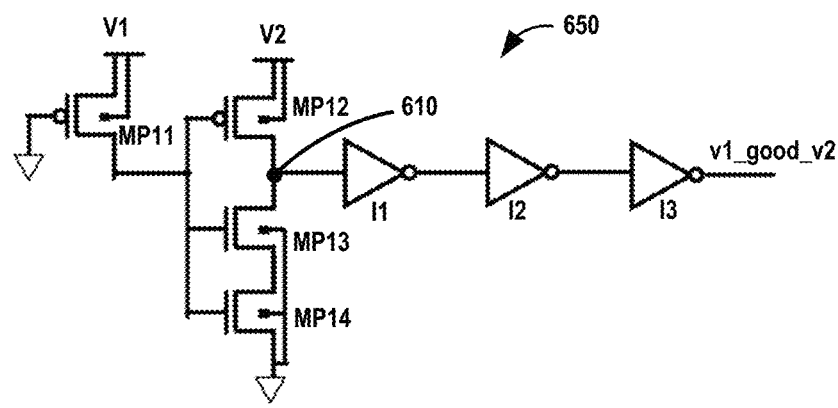
FIG. 8B is a circuit diagram for the power detector of FIG. 8A.
Figure 8C:
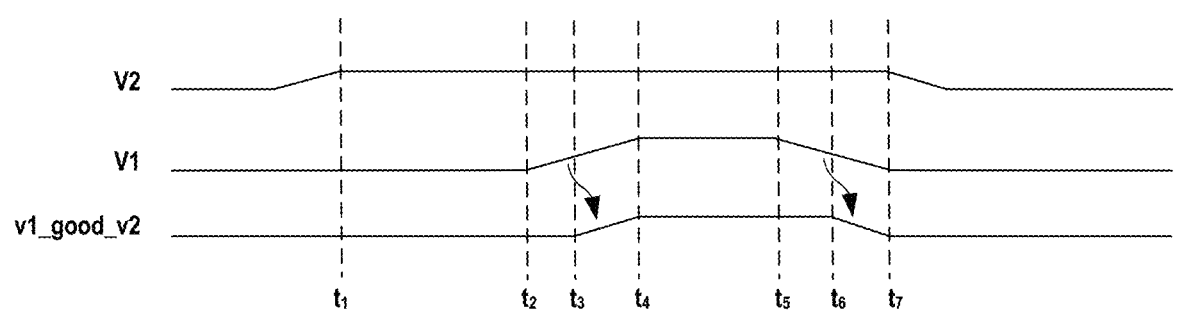
FIG. 8C is a timing diagram for the example power detector of FIG. 8A.

FIG. 8A is a block diagram of example power detector logic 650 and FIG. 8B is a diagram illustrating the example power detector logic 650 of FIG. 8A in further detail, in accordance with one or more techniques of this disclosure. FIG. 8C is a timing diagram for the example power detector of FIGS. 8A and 8B. Power detector logic 650 is configured to prevent forward biasing of the MP0, MP1 and MP2 n-wells during a system cold boot, when second voltage V2 reaches its peak before first voltage V1 reaches its peak (in other words, when second voltage V2 is valid but first voltage V1 is not yet valid).

Power detector logic 650 includes four transistors, MP11, MP12, MP13 and MP14, and three inverters, I1, I2, and I3. The source and the n-well of transistor MP11 are tied to first voltage V1. The gate of transistor MP11 is tied to ground. The source and n-well of transistor MP12 are tied to second voltage V2. The source of transistor MP13 is tied to the drain of transistor MP12 and the drain of transistor MP13 is tied to the source of transistor MP14. The drain of transistor MP14 and the n-wells of transistors MP13 and MP14 are tied to ground. The gates of transistors MP13 and MP14 are tied to the drain of transistor MP11. An inverted input to the gate of transistor MP12 is also tied to the drain of transistor MPH. Three inverters, I1, I2, and I3 are connected in series, with the input to inverter I1 tied to a node 810 defined by the source and drain of transistors MP13 and MP12, respectively. The output of inverter I3 is the output of power detector logic 850 and includes the signal v1_good_v2.

The purpose of power detector logic 850 is to prevent forward biasing of the n-wells of transistors MP0, MP1, and MP2 during a cold system boot. During a cold boot, the second voltage, V2, reaches its peak before first voltage V1 reaches its peak. Power detector logic 850 is configured such that:

$v1\_good\_v2=1$ when $V1 > V2 - V_{offset}$ $V_{offset}$ comes from the trip point of the "inverter" (MP12/MP13/MP14). The node 610 flops when the gates of the transistors are above the trip point of the inverter. The trip point may be raised by stacking MP13/MP14 and using N type transistors with high-VT and P-type transistors with low VT.

The timing diagram of FIG. 8C illustrates operation of power detector logic 650. Upon cold boot, V2 reaches its peak voltage at time $t_1$. At time $t_2$, V1 starts to rise. At time t3, the condition $V1 > V2 - V_{offset}$ is met and the signal v1_good_v2 starts to rise. V1 reaches its peak voltage at time $t_4$. Also at time $t_4$, signal v1_good_v2=1 and remains so as long as the condition $V1 > V2 - V_{offset}$ is met. At time $t_5$, V1 starts to go low and the condition $V1 > V2 - V_{offset}$ is no longer met, at which time v1_good_v2 starts to go low. At time $t_7$, both V1 and v1_good_v2 are low.

Figure 9:
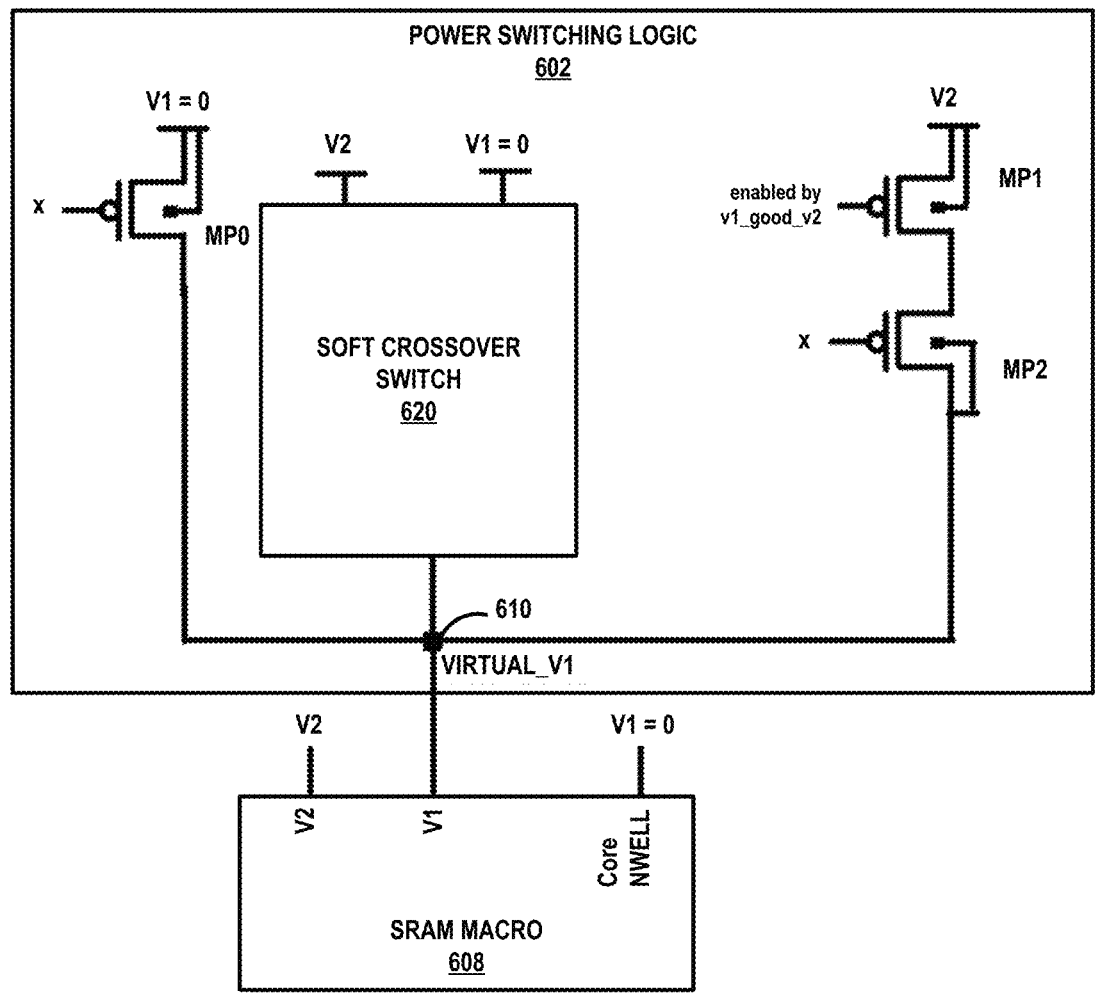
FIG. 9 is a diagram illustrating example power switching logic and example SRAM macro, in accordance with one or more techniques of this disclosure.

FIG. 9 is a diagram illustrating example power switching logic 602 and example SRAM macro 608, in accordance with one or more techniques of this disclosure. During a cold boot, when V1=0 and V2=0.6, MP0 and MP2 are turned off and the source and n-well of MP1 receive the value of second voltage V2 and the gate of transistor MP1 is forced off by the control signal v1_good_v2 from the power detector. In other words, MP1 is forced off once v1_good_v2=1 (e.g., both V1 and V2 are valid), so MP1 is turned on when V1=0 and V2=0.6, and turned off when both V1 and V2 are valid/high. Under these conditions, MP1 is not forward biased (that is, the n-well of MP1 is not biased lower than the source of MP1). This further has the result of isolating the MP2 n-well and VIRTUAL_V1 such that the MP2 n-well is also not forward biased during a cold boot.

Figure 10A:
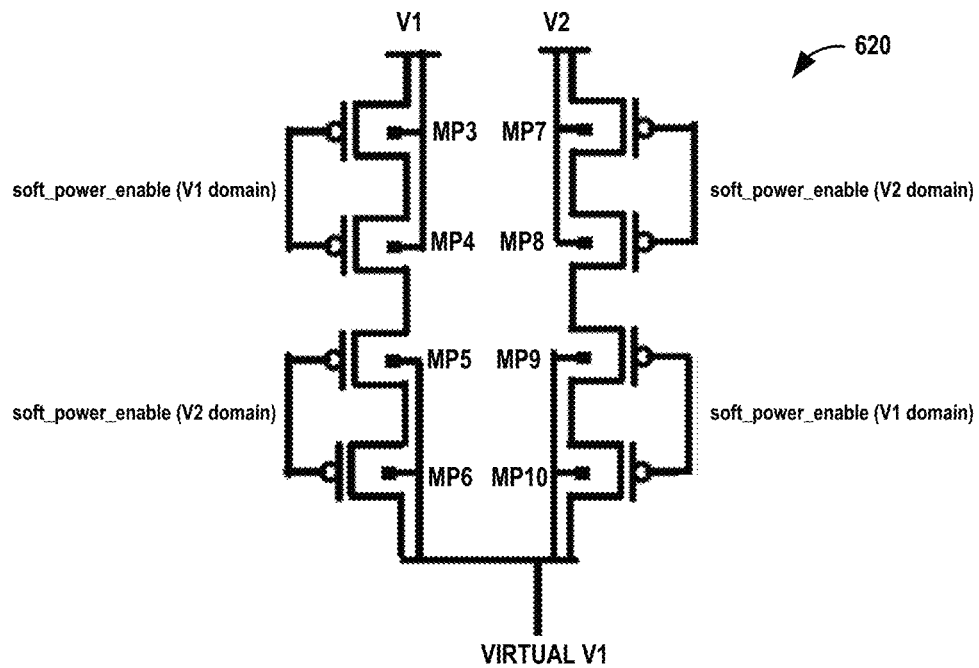
FIG. 10A is a diagram illustrating example soft crossover switch logic in accordance with one or more techniques of this disclosure in further detail.
Figure 10B:
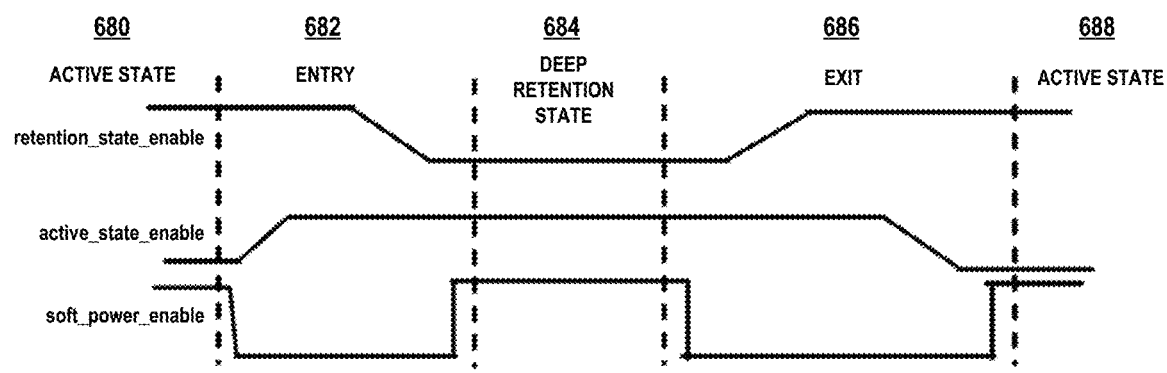
FIG. 10B is a timing diagram corresponding to the soft crossover switch of FIG. 10A.

FIG. 10A is a diagram illustrating example soft crossover switch logic 620 in accordance with one or more techniques of this disclosure in further detail, and FIG. 10B is a timing diagram for soft crossover switch 620 of FIG. 10A. Soft crossover logic 620 is configured to minimize crowbar power and noise between V1 and V2 during entry into the deep retention state from the active state and/or during exit from the deep retention state to the active state. Soft crossover logic 620 is further configured to prevent excessive droop on VIRTUAL_V1 and excessive cross domain noise injection or crowbar power during entry into and/or exit from deep retention mode.

Soft crossover switch 620 includes eight transistors arranged in four pairs of two transistors each. A first transistor pair includes transistors MP3 and MP4 both having n-wells tied to first voltage V1. The source of transistor MP3 is tied to first voltage V1 and the drain of transistor MP3 is tied to the source of transistor MP4. A second transistor pair includes transistors MP5 and MP6 both having n-wells tied to the output VIRTUAL_V1 of power switching logic 602. The source of transistor MP5 is tied to the drain of transistor MP4 and the source of transistor MP6 is tied to the drain of transistor MP5.

A third transistor pair includes transistors MP7 and MP8 both having n-wells tied to second voltage V2. The source of transistor MP7 is tied to second voltage V2 and the drain of transistor MP7 is tied to the source of transistor MP8. A fourth transistor pair includes transistors MP9 and MP10 both having n-wells tied to the output VIRTUAL_V1 of power switching logic 602. The source of transistor MP9 is tied to the drain of transistor MP8 and the source of transistor MP10 is tied to the drain of transistor MP9.

The gates of the transistor pairs are tied to a control signal, soft_power_enable, and are pulsed during the transitions from the active state to the deep retention state (entry to the deep retention state) or during transitions from the deep retention state to the active state (exit from the deep retention state). The soft_power_enable signal is supplied by a controller, such as embedded SRAM controller 612 as shown in FIG. 6. More generally, additional transistors may be stacked in the soft-crossover switch to increase the effective resistance of the switch to enable a more gradual switching between power-states and lower crowbar currents.

FIG. 10B is a timing diagram showing the soft_power_enable signal, retention_state_enable signal and active_state_enable signal during the active state (680), entry to the deep retention state (682), deep retention state (684), exit from the deep retention state (686) and back to the active state (688). In general, the soft_power_enable signal is high in the active state (680 and 688), in the deep retention state (684), and the soft_power_enable signal is low during the transitions (682, 686) between the active state and the deep retention state. In other words, the states can only be switched when the soft power enable signal is low in this example.

In the first active state (680), the active_state_enable signal is low, the retention_state_enable signal is high, and soft_power_enable signal is high such that voltage V2 is supplied at VIRTUAL_V1. To enter into deep retention state (684) from the active state (680), a controller, such as SRAM controller 612 embedded on the SRAM unit 600 as shown in FIG. 6, causes the soft_power_enable signal to transition from high to low (682). The soft_power_enable pulse is applied to the gates of transistor pair MP7/MP8 and transistor pair MP5/MP6 of soft crossover switch 620, with the result that voltage V1 is isolated from the output VIRUTAL_V1 by transistor pair MP5/MP6 and second voltage V2 is supplied at VIRTUAL_V1 via transistor pairs MP7/MP8 and MP9/MP10.

Next, the controller causes the active_power_enable signal to transition from low to high, turning off power gating transistors MP0 and MP2 of power switching logic 602 (FIG. 7). Next, the controller causes the retention_state_enable signal to transition from high to low, turning on power gating transistor MP1 of power switching logic 602 and supplying second voltage V2 at output VIRTUAL_V1 via transistor MP1. The controller then causes the soft_power_enable signal to transition from low to high, at which point the SRAM bitcell array is in deep retention mode 684.

To exit (686) the deep retention state and move to the active state (688), the controller first causes the soft_power_enable signal to transition from high to low. The soft_power_enable pulse is applied to the gates of transistor pair MP3/MP4 and transistor pair MP9/MP10 of soft crossover switch 620, with the result that voltage V2 is isolated from the output VIRUTAL_V1 by transistor pair MP9/MP10 and first voltage V1 is supplied at VIRTUAL_V1 via transistor pairs MP3/MP4 and MP5/MP6.

Next, the controller causes the retention_state_enable signal to transition from low to high, turning off power gating transistor MP1 of power switching logic 602. Next, the controller causes the active_power_enable signal to transition from high to low, turning on power gating transistors MP0 and MP2 of power switching logic 602 and supplying first voltage V1 at output VIRTUAL_V1. The controller then causes the soft_power_enable signal to transition from low to high, at which point the SRAM bitcell array is in the active state (688).

In this way, soft crossover switch 620 ensures that the appropriate voltages are supplied to output VIRTUAL_V1 to cover the non-overlapping switching of power gates MP0 and MP1 during switching between the active state and the deep retention state. This also prevents excessive droop on VIRTUAL_V1 and excessive cross voltage domain noise injection or crowbar power during the entry and exit transition states.

Figure 11A:
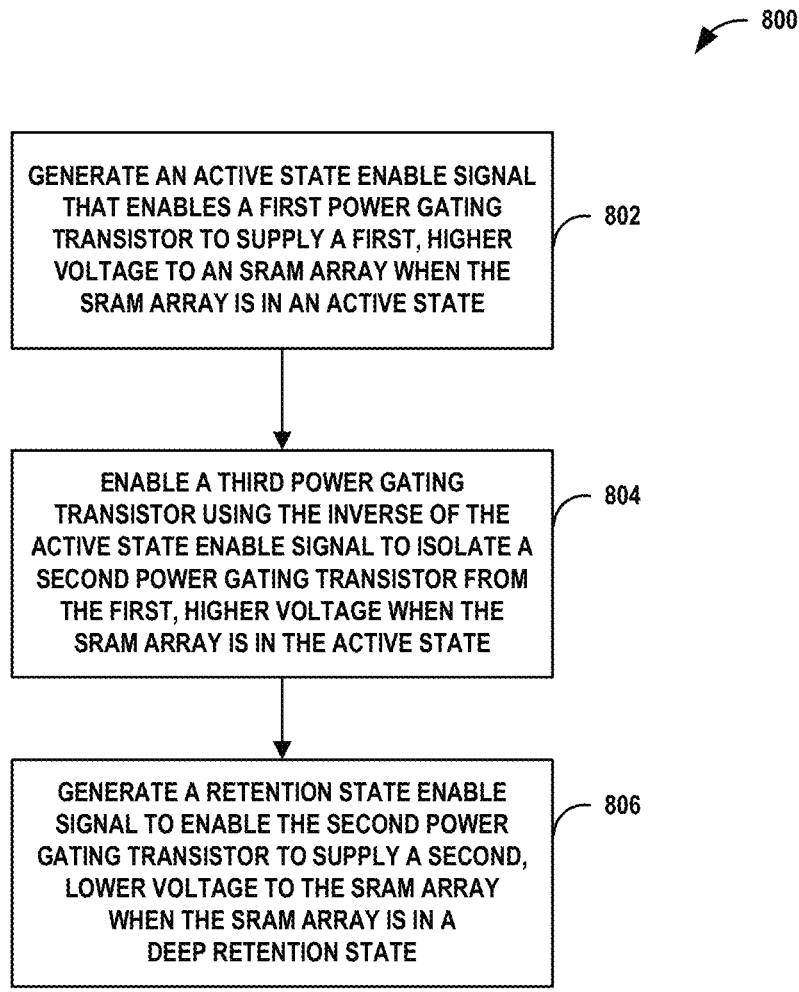
FIGS. 11A-11C are a flow diagrams illustrating example processes by which a controller may control power switching logic to supply voltages to an SRAM array to reduce SRAM power leakage, in accordance with one or more techniques described in this disclosure.

FIG. 11A is a flow diagram illustrating an example process (800) by which a controller may control power switching logic, such as power switching logic 602 of FIG. 7) to supply power to an SRAM array in order to reduce SRAM power leakage, in accordance with one or more techniques described in this disclosure.

A controller supplies an active_state_enable signal that enables a first power gating transistor (e.g., power gating transistor MP0 of FIG. 7) to supply a first, higher voltage (e.g., V1) to an SRAM array when the SRAM array is in an active state (802). The controller supplies the inverse of the active_state_enable signal to a third power gating transistor (e.g., power gating transistor MP2 of FIG. 7) to isolate a second power gating transistor from the first, higher voltage when the SRAM array is in the active state (804). The controller generates a retention enable signal that enables the second power gating transistor (e.g., power gating transistor MP1 of FIG. 7) to supply a second, lower voltage (e.g., V2) to an SRAM array when the SRAM array is in a deep retention state (804).

Figure 11B:
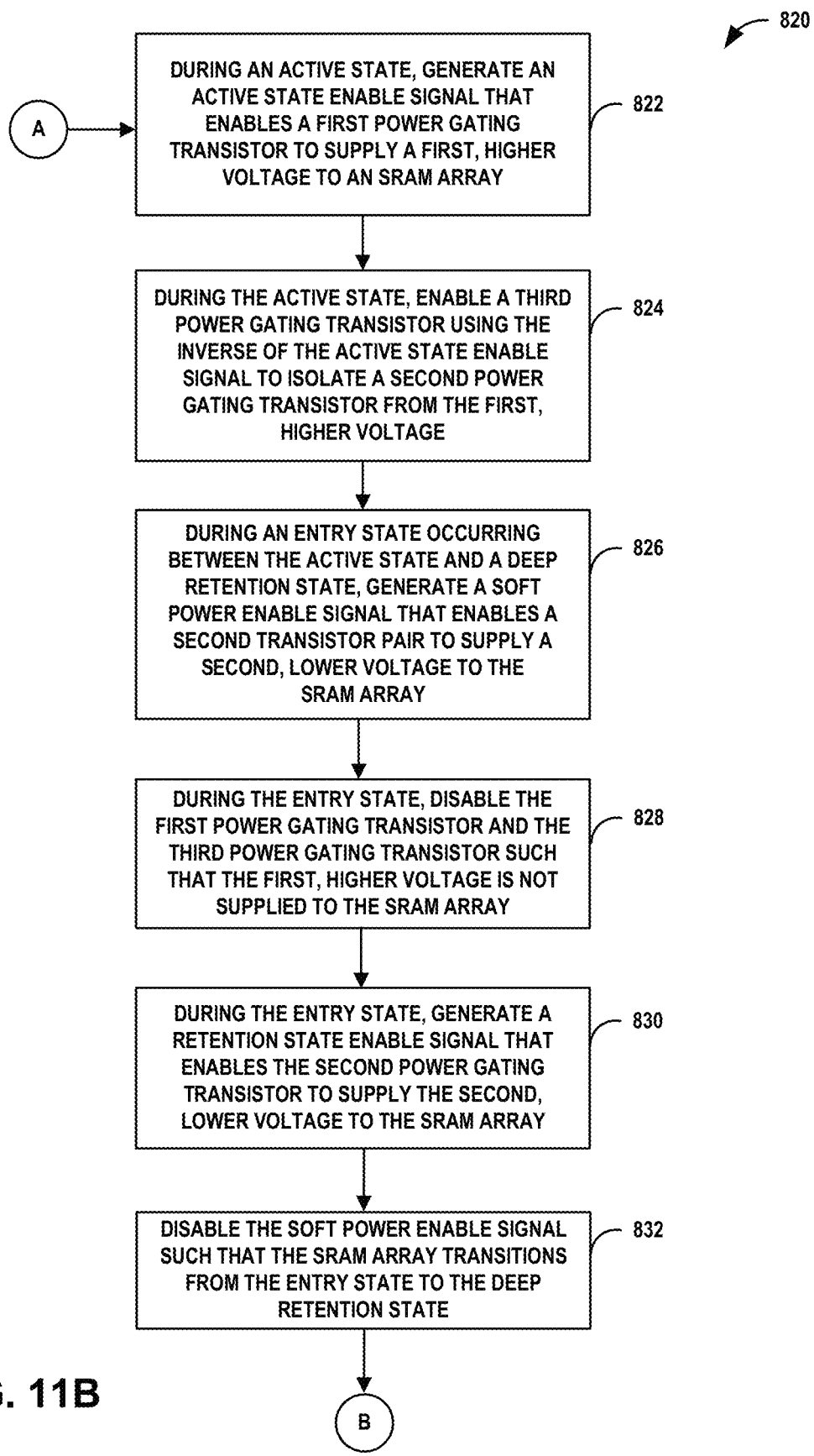
Figure 11C:
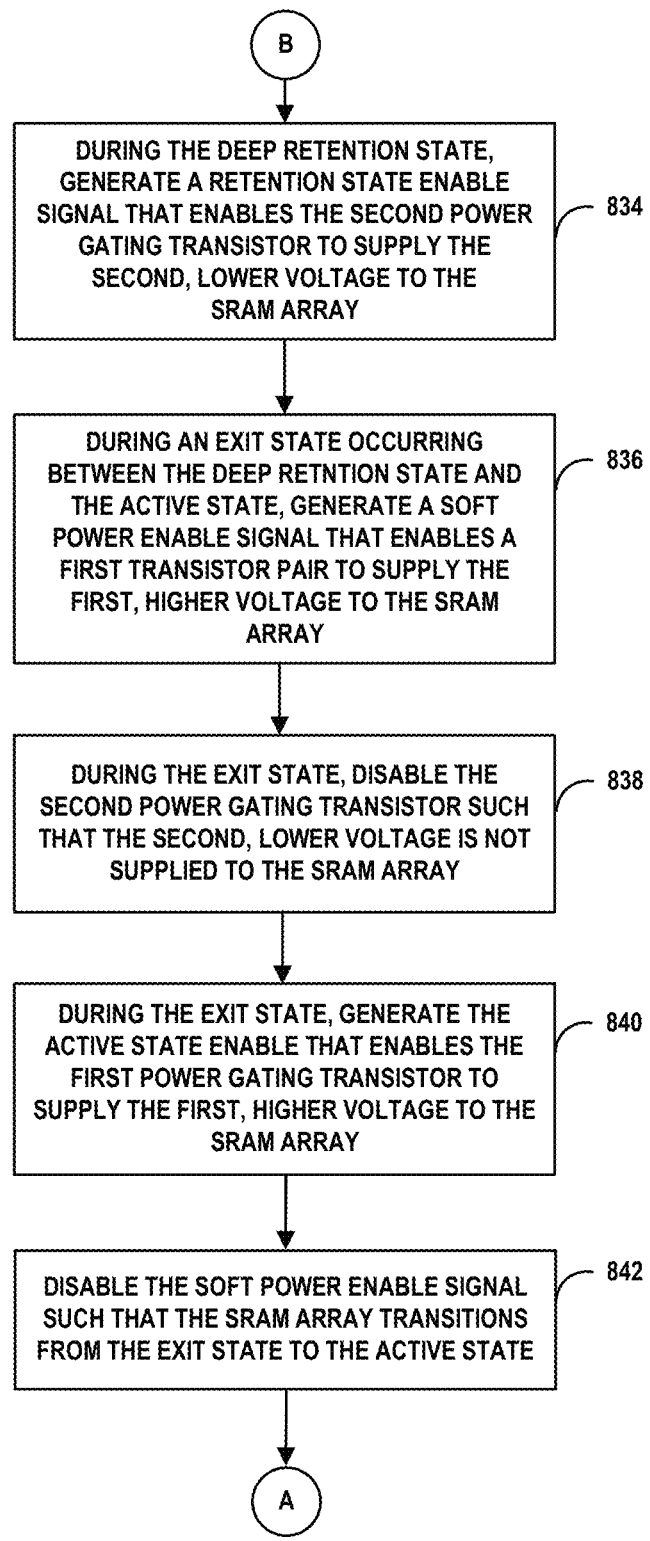

FIG. 11B-11C are a flow diagram illustrating another example process (820) by which a controller, such as embedded SRAM controller 612 of FIG. 6, may control power switching logic, such as power switching logic 602 of FIG. 7, to supply power to an SRAM array in order to reduce SRAM power leakage, in accordance with one or more techniques described in this disclosure.

A controller generates an active_state_enable signal that enables a first power gating transistor (e.g., power gating transistor MP0 of FIG. 7) to supply a first, higher voltage (e.g., V1) to an SRAM array when the SRAM array is in an active state (822). The controller supplies the inverse of the active_state_enable signal to a third power gating transistor (e.g., power gating transistor MP2 of FIG. 7) to isolate a second power gating transistor from the first, higher voltage when the SRAM array is in the active state (824).

During an entry state occurring between the active state and a deep retention state, the controller generates a soft power enable signal that enables a second transistor pair to supply a second, lower voltage to the SRAM array (826). During the entry state, the controller disables the first and third power gating transistors such that the first, higher voltage is not supplied to the SRAM array (828).

During the entry state, the controller generates a retention enable signal that enables the second power gating transistor (e.g., power gating transistor MP1 of FIG. 7) to supply the second, lower voltage (e.g., V2) to the SRAM array (830). The controller disables the soft power enable signal such that the second transistor pair stops supplying the second, lower voltage to the SRAM array and the SRAM array transitions from the entry state to the deep retention state (832).

During an exit state occurring between the deep retention state and the active state, the controller generates a soft power enable signal that enables a first transistor pair to supply the first, higher voltage to the SRAM array (836). During the exit state, the controller disables the second power gating transistor such that the second, lower voltage is not supplied to the SRAM array (838).

During the exit state, the controller generates the active_state_enable signal that enables the first power gating transistor (e.g., power gating transistor MP0 of FIG. 7) to supply the first, higher voltage (e.g., V1) to the SRAM array (840). The controller disables the soft power enable signal such that the second transistor pair stops supplying the second, lower voltage to the SRAM array and the SRAM array transitions from the exit state to the active state (842). The process (820) shown in FIGS. 11B and 11C may repeat whenever the SRAM array is to be transitioned into or out of the deep retention state.

As described by way of various examples herein, the techniques of the disclosure may include or be implemented in conjunction with an artificial reality system. As described, artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured content (e.g., real-world photographs). The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may be associated with applications, products, accessories, services, or some combination thereof, that are, e.g., used to create content in an artificial reality and/or used in (e.g., perform activities in) an artificial reality. The artificial reality system that provides the artificial reality content may be implemented on various platforms, including a head-mounted device (HMD) connected to a host computer system, a standalone HMD, a mobile device or computing system, or any other hardware platform capable of providing artificial reality content to one or more viewers.

The techniques described in this disclosure may be implemented, at least in part, in hardware, software, firmware or any combination thereof. For example, various aspects of the described techniques may be implemented within one or more processors, including one or more microprocessors, DSPs, application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit comprising hardware may also perform one or more of the techniques of this disclosure.

Such hardware, software, and firmware may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components or integrated within common or separate hardware or software components.

The techniques described in this disclosure may also be embodied or encoded in a computer-readable medium, such as a computer-readable storage medium, containing instructions. Instructions embedded or encoded in a computer-readable storage medium may cause a programmable processor, or other processor, to perform the method, e.g., when the instructions are executed. Computer readable storage media may include random access memory (RAM), read only memory (ROM), programmable read only memory (PROM), erasable programmable read only memory (EPROM), electronically erasable programmable read only memory (EEPROM), flash memory, a hard disk, a CD-ROM, a floppy disk, a cassette, magnetic media, optical media, or other computer readable media.

As described by way of various examples herein, the techniques of the disclosure may include or be implemented in conjunction with an artificial reality system. As described, artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured content (e.g., real-world photographs). The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may be associated with applications, products, accessories, services, or some combination thereof, that are, e.g., used to create content in an artificial reality and/or used in (e.g., perform activities in) an artificial reality. The artificial reality system that provides the artificial reality content may be implemented on various platforms, including a head mounted device (HMD) connected to a host computer system, a standalone HMD, a mobile device or computing system, or any other hardware platform capable of providing artificial reality content to one or more viewers.

What is claimed is:

1. An artificial reality system comprising:
a plurality of processors; and
a Static Random Access Memory (SRAM) unit in communication with the plurality of processors, the SRAM unit comprising:
an SRAM array including a plurality of SRAM bitcells; and
power switching logic comprising a first power gating transistor, a second power gating transistor, and a third power gating transistor, and wherein:
during an active state, the first power gating transistor supplies a first voltage to the SRAM array;
during the active state, the third power gating transistor isolates the second power gating transistor from the first voltage; and
during a deep retention state, the second power gating transistor supplies a second voltage to the SRAM array, wherein the second voltage is lower than the first voltage such that SRAM power leakage experienced by the SRAM array in the deep retention state is less than the SRAM power leakage experienced by the SRAM array in the active state.

2. The artificial reality system of claim 1, further comprising:
a head-mounted display comprising:
one or more processors configured to output artificial reality content; and
one or more System on a Chip (SoC) integrated circuits including the SRAM array,
the one or more SoC integrated circuits further including the power switching logic configured to reduce power leakage in the SRAM array.

3. The artificial reality system of claim 1, further comprising:
a System on a Chip (SoC) integrated circuit comprising:
one or more processors configured to process artificial reality content;
the SRAM array; and
the power switching logic configured to reduce power leakage in the SRAM array.

4. The artificial reality system of claim 1, further comprising:
a peripheral device comprising:
one or more processors configured to receive one or more inputs from a user of the artificial reality system;
the SRAM array; and
the power switching logic configured to reduce power leakage in the SRAM array.

5. The artificial reality system of claim 1, further comprising:
a power management controller; and
soft crossover switch logic including a first transistor pair connected to receive the first voltage and a second transistor pair connected to receive the second voltage, and further wherein:
during an entry state occurring between the active state and the deep retention state, the power management controller enables the second transistor pair to supply the second voltage to the SRAM array;
during the entry state, the power management controller disables the first and third power gating transistors such that the first voltage is not supplied to the SRAM array; and
during the entry state, the power management controller enables the second power gating transistor to supply the second voltage to the SRAM array.

6. The artificial reality system of claim 5, wherein the power management controller disables the second transistor pair such that the second transistor pair stops supplying the second voltage to the SRAM array and the SRAM array transitions from the entry state to the deep retention state.

7. The artificial reality system of claim 1, further comprising:
a power management controller;
soft crossover switch logic including a first transistor pair connected to receive the first voltage and a second transistor pair connected to receive the second voltage, and further wherein:
during an exit state occurring between the deep retention state and the active state, the power management controller enables the first transistor pair to supply the first voltage to the SRAM array;
during the exit state, the power management controller disables the second power gating transistor such that the second voltage is not supplied to the SRAM array by the second gating transistor; and
during the exit state, the power management controller enables the first power gating transistor to supply the first voltage to the SRAM array.

8. The artificial reality system of claim 7 wherein the power management controller disables the first transistor pair such that the first transistor pair stops supplying the first voltage to the SRAM array and the SRAM array transitions from the exit state to the active state.

9. The artificial reality system of claim 1 further comprising:
a power detector circuit configured to generate a control signal indicative of whether the first voltage and the second voltage are both valid, wherein the control signal enables the second power gating transistor to isolate the third power gating transistor from the first voltage when the first voltage is not valid.

10. The artificial reality system of claim 1 wherein the first voltage is equal to 0.75 Volts and the second voltage is equal to 0.6 Volts.

11. The artificial reality system of claim 1, wherein:
a source of the first power gating transistor and an n-well of the first power gating transistor are connected to the first voltage,
a source of the second power gating transistor and an n-well of the second power gating transistor are connected to the second voltage,
a source of the third power gating transistor is connected to a drain of the second power gating transistor,
a drain of the first power gating transistor and a drain of the third power gating transistor are tied to an output node of the power switching logic, and
an n-well of the third power gating transistor is tied to the output node of the power switching logic.

12. The artificial reality system of claim 11, wherein a voltage supply input to the SRAM array is connected to the output node of the power switching logic.

13. A method for controlling SRAM power leakage in a System on a Chip (SoC) integrated circuit, the SoC integrated circuit including a power management controller, the method comprising:
during an active state, generating, by the power management controller, an active state enable signal that enables a first power gating transistor to supply a first voltage to an SRAM array;
during the active state, supplying, by the power management controller, the active state enable signal to a third power gating transistor to isolate a second power gating transistor from the first voltage; and
during a deep retention state, generating, by the power management controller, a retention enable signal that enables the second power gating transistor to supply a second voltage to the SRAM array, wherein the second voltage is lower than the first voltage such that SRAM power leakage experienced by the SRAM array in the deep retention state is less than the SRAM power leakage experienced by the SRAM array in the active state.

14. The method of claim 13 further comprising:
during an entry state occurring between the active state and the deep retention state, generating, by the power management controller, a soft power enable signal that enables a second transistor pair to supply the second voltage to the SRAM array;
during the entry state, disabling, by the power management controller, the first and third power gating transistors such that the first voltage is not supplied to the SRAM array; and
during the entry state, generating, by the power management controller, a retention enable signal that enables the second power gating transistor to supply the second voltage to the SRAM array.

15. The method of claim 14 further comprising:
disabling, by the power management controller, the soft power enable signal such that the second transistor pair stops supplying the second voltage to the SRAM array and the SRAM array transitions from the entry state to the deep retention state.

16. The method of claim 13 further comprising:
during an exit state occurring between the deep retention state and the active state, generating, by the power management controller, a soft power enable signal that enables a first transistor pair to supply the first voltage to the SRAM array;
during the exit state, disabling, by the power management controller, the second power gating transistor such that the second voltage is not supplied to the SRAM array by the second gating transistor; and
during the exit state, generating, by the power management controller, the active state enable signal that enables the first power gating transistor to supply the first voltage to the SRAM array.

17. The method of claim 16 further comprising:
disabling, by the power management controller, the soft power enable signal such that the first transistor pair stops supplying the first voltage to the SRAM array and the SRAM array transitions from the exit state to the active state.

18. The method of claim 13, further comprising:
generating, by a power detector circuit, a control signal indicative of whether the first voltage and the second voltage are both valid; and
enabling the second power gating transistor with the control signal such that the third power gating transistor is isolated from the first voltage when the first voltage is not valid.

19. The method of claim 18, further comprising:
enabling, by the power detector circuit, the second power gating transistor with the control signal such that the third power gating transistor is isolated from the first voltage when the first voltage is not valid.

20. A non-transitory computer-readable storage medium comprising instructions that, when executed, configure processing circuitry to:

during an active state, generate, by a power management controller, an active state enable signal that enables a first power gating transistor to supply a first voltage to an SRAM array when the SRAM array is in an active state;

during the active state, supply, by a power management controller, the active state enable signal to a third power gating transistor to isolate a second power gating transistor from the first voltage; and during a deep retention state, generate, by the power management controller, a retention enable signal that enables the second power gating transistor to supply a second voltage to the SRAM array, wherein the second voltage is lower than the first voltage such that SRAM power leakage experienced by the SRAM array in the deep retention state is less than the SRAM power leakage experienced by the SRAM array in the active state.

* * * * *